United States Patent
Kitaoka et al.

(10) Patent No.: US 7,524,691 B2
(45) Date of Patent: Apr. 28, 2009

(54) METHOD OF MANUFACTURING GROUP III NITRIDE SUBSTRATE

(75) Inventors: Yasuo Kitaoka, Ibaraki (JP); Hisashi Minemoto, Hirakata (JP); Isao Kidoguchi, Kawanishi (JP); Akihiko Ishibashi, Mishima-gun (JP)

(73) Assignee: Panasonic Corporation, Osaka (JP)

( * ) Notice: Subject to any disclaimer, the term of this patent is extended or adjusted under 35 U.S.C. 154(b) by 614 days.

(21) Appl. No.: 10/758,815

(22) Filed: Jan. 16, 2004

(65) Prior Publication Data

US 2004/0147096 A1 Jul. 29, 2004

(30) Foreign Application Priority Data

Jan. 20, 2003 (JP) .............................. 2003-011569

(51) Int. Cl.
*H01L 21/00* (2006.01)
(52) U.S. Cl. .......................................... 438/46; 257/90
(58) Field of Classification Search .................. 438/46, 438/47, 22, 478
See application file for complete search history.

(56) References Cited

U.S. PATENT DOCUMENTS

| | | | |
|---|---|---|---|
| 3,811,963 A | 5/1974 | Hawrylo et al. | |
| 3,933,538 A | 1/1976 | Akai et al. | |
| 5,868,837 A | 2/1999 | DiSalvo et al. | |
| 6,121,121 A | 9/2000 | Koide | |
| 6,252,255 B1 | 6/2001 | Ueta et al. | |
| 6,270,569 B1 | 8/2001 | Shibata et al. | |
| 6,447,604 B1 | 9/2002 | Flynn et al. | |
| 6,471,770 B2 * | 10/2002 | Koike et al. | 117/97 |
| 6,503,610 B2 | 1/2003 | Hiramatsu et al. | |

(Continued)

FOREIGN PATENT DOCUMENTS

EP 0 967 664 12/1999

(Continued)

OTHER PUBLICATIONS

Kawamura, et al., "Growth of a Large GaN Single Crystal Using the Liquid Phase Epitaxy (LPE)Technique", Jpn. J. Appl. Phys., vol. 42, part 2, No. 1 A/B, Jan. 15, 2003, pp. L4-L6.

(Continued)

*Primary Examiner*—W. David Coleman
*Assistant Examiner*—Sonya D McCall Shepard
(74) *Attorney, Agent, or Firm*—Hamre, Schumann, Mueller & Larson, P.C.

(57) ABSTRACT

The present invention provides a manufacturing method that makes it possible to manufacture a substrate that is formed of high-quality Group III nitride crystals alone and has less warping. A Group III nitride layer (a seed layer and a selective growth layer) including gaps is formed on a substrate (a sapphire substrate). In an atmosphere containing nitrogen, the surface of the Group III nitride layer is brought into contact with a melt containing alkali metal and at least one Group III element selected from gallium, aluminum, and indium, and thereby the at least one Group III element and the nitrogen are made to react with each other to grow Group III nitride crystals (GaN crystals) on the Group III nitride layer. Thereafter, a part including the substrate and a part including the Group III nitride crystals are separated from each other in the vicinities of the gaps.

25 Claims, 11 Drawing Sheets

U.S. PATENT DOCUMENTS

| | | | |
|---|---|---|---|
| 6,592,663 | B1 | 7/2003 | Sarayama et al. |
| 6,614,059 | B1 | 9/2003 | Tsujimura et al. |
| 6,667,252 | B2 | 12/2003 | Miyajima et al. |
| 6,720,586 | B1 * | 4/2004 | Kidoguchi et al. .......... 257/103 |
| 2003/0042496 | A1 | 3/2003 | Sasaoka |
| 2003/0143771 | A1 * | 7/2003 | Kidoguchi et al. ............ 438/46 |
| 2003/0162340 | A1 * | 8/2003 | Tezen ........................ 438/184 |
| 2004/0016396 | A1 * | 1/2004 | Nagai et al. .................... 117/84 |
| 2004/0124434 | A1 | 7/2004 | D'Evelyn et al. |
| 2004/0144300 | A1 | 7/2004 | Kitaoka et al. |
| 2004/0147096 | A1 | 7/2004 | Kitaoka et al. |
| 2004/0183090 | A1 | 9/2004 | Kitaoka et al. |
| 2004/0262630 | A1 | 12/2004 | Kitaoka et al. |
| 2005/0000407 | A1 * | 1/2005 | Takeya et al. ................. 117/88 |
| 2005/0011432 | A1 | 1/2005 | Kitaoka et al. |
| 2005/0082564 | A1 | 4/2005 | Kitaoka et al. |

FOREIGN PATENT DOCUMENTS

| | | |
|---|---|---|
| EP | 1 184 897 | 3/2002 |
| JP | 57-78132 | 5/1982 |
| JP | 11-145516 | 5/1999 |
| JP | 2001-176813 | 6/2001 |
| JP | 2002-293696 | 10/2002 |
| JP | 3409576 | 3/2003 |
| JP | 2000-357663 | 12/2003 |
| WO | 2004/013385 | 2/2004 |

OTHER PUBLICATIONS

Kozawa, et al., "Raman scattering from LO phonon-plasmon coupled modes in gallium nitride", Journal of Applied Physics, Jan. 15, 1994, 74(2), 1098-1101—Abstract Only.

M. Morishita, et al. "The growth mechanism of GaN singles crystals in Na flux system", Journal of the Japanese association for crystal growth, vol. 30, No. 3 (2003), 801aA7.

M. Morishita, et al., "Growth of transparent GaN single crystals using LPE technique in Na flux system", The Japan Society of Applied Physics and Related Societies, Extended Abstracts (The 51st Spring Meeting, 2004), 29 p-YK-6.

Gavrilin, et al., "Liquid-Phase Epitaxy of Gallium Nitride from Lithium-Gallium Melts", Journal of Advanced Materials, vol. 5, No. 2, pp. 21-25, 2000.

Aoki, et al., "Growth of 5 mm GaN Single Crystals at 750° C. from an Na-Ga Melt", Crystal Growth & Design, vol. 1, No. 2, pp. 119-122, 2001.

Bohyama, et al., "Distribution of Threading Dislocations in Epitaxial Lateral Overgrowth GaN by Hydride Vapor-Phase Epitaxy Using Mixed Carrier Gas of $H_2$ and $N_2$", Jpn. J. Appl. Phys., vol. 41 (2002), pp. 75-76, Part 1, No. 1, Jan. 2002.

Yoshimoto, et al., "Low-Temperature Microscopic Photoluminescence Images of Epitaxially Laterally Overgrown GaN", Jpn. J. Appl. Phys., vol. 40 (2001), pp. L386-L388, Part 2, No. 4B, Apr. 15, 2001.

* cited by examiner

METHOD OF MANUFACTURING GROUP III NITRIDE SUBSTRATE

BACKGROUND OF THE INVENTION

1. Field of the Invention

The present invention relates generally to a method of manufacturing a Group III nitride substrate (a substrate containing Group III nitride crystals).

2. Related Background Art

A Group III nitride compound semiconductor such as, for instance, gallium nitride (GaN) (hereinafter also referred to as a "Group III nitride semiconductor" or a "GaN-based semiconductor") has been gaining attention as a material for semiconductor elements that emit blue or ultraviolet light. A blue laser diode (LD) is used for high-density optical disk devices or displays while a blue light emitting diode (LED) is used for displays, lighting, etc. It is expected to use an ultraviolet LD in the field of biotechnology or the like and an ultraviolet LED as an ultraviolet source for a fluorescent lamp.

Generally, substrates of a Group III nitride semiconductor (for example, GaN) that are used for LDs or LEDs are formed through vapor phase epitaxy. For instance, substrates have been used that are obtained through heteroepitaxial growth of Group III nitride crystals on a sapphire substrate. However, the sapphire substrate and the GaN crystals are different from each other in lattice constant by 13.8% and in coefficient of linear expansion by 25.8%. Hence, a sufficiently high crystallinity cannot be obtained in the GaN thin film obtained through the vapor phase epitaxy. Generally, crystals obtained by this method have a dislocation density of $10^8$ cm$^{-2}$ to $10^9$ cm$^{-2}$ and thus the reduction in dislocation density has been an important issue. In order to resolve this issue, efforts have been made to reduce the dislocation density and thereby, for example, an epitaxial lateral overgrowth (ELOG) method has been developed. With this method, the dislocation density can be reduced to around $10^5$ cm$^{-2}$ to $10^6$ cm$^{-2}$, but the manufacturing process is complicated.

On the other hand, besides the vapor phase epitaxy, a method of carrying out crystal growth from liquid phase also has been studied. However, since the equilibrium vapor pressure of nitrogen is at least 10000 atm at the melting point of a Group III nitride single crystal such as, for instance, GaN or AlN, conventionally it has been understood that a condition of 8000 atm at 1200° C. is required for growing GaN from a liquid phase. In this connection, recently, it was made clear that GaN was able to be synthesized at relatively low temperature and pressure, specifically, 750° C. and 50 atm, by using a Na flux.

Recently, single crystals with the maximum crystal size of about 1.2 mm are obtained by a method in which a mixture of Ga and Na is melted in a nitrogen gas atmosphere containing ammonia at 800° C. and 50 atm, and then the single crystals are grown for 96 hours using the melt (for instance, JP2002-293696A).

Furthermore, another method has been reported in which, after a GaN crystal layer is formed on a sapphire substrate by a metal organic chemical vapor deposition (MOCVD) method, single crystals are grown by a liquid phase epitaxy (LPE) method.

Generally, for instance, a sapphire substrate is used for manufacturing a Group III nitride substrate. However, such a substrate and a Group III nitride crystal are different from each other in lattice constant and coefficient of thermal expansion. Hence, when Group III nitride crystals are grown using such a substrate, the substrate may be distorted or warped in some cases. Accordingly, the substrate may be damaged during crystal growth or it may be difficult to manufacture a device using a semiconductor substrate formed in the above-mentioned manner in some cases. For instance, mask alignment may be difficult, for example in the case of using a stepper to be employed in a device manufacturing process.

SUMMARY OF THE INVENTION

With such a situation in mind, the present invention is intended to provide a manufacturing method that makes it possible to manufacture a substrate that is formed of high-quality Group III nitride crystals alone and has less warping.

In order to achieve the aforementioned object, a first manufacturing method of the present invention is a method of manufacturing a Group III nitride substrate including the steps of (i) forming a Group III nitride layer including gaps, on a substrate; (ii) bringing a surface of the Group III nitride layer into contact with a melt containing alkali metal and at least one Group III element selected from gallium, aluminum, and indium, in an atmosphere containing nitrogen, to make the at least one Group III element and the nitrogen react with each other to grow Group III nitride crystals on the Group III nitride layer; and (iii) separating a part including the substrate and a part including the Group III nitride crystals from each other in the vicinities of the gaps.

Furthermore, a second manufacturing method of the present invention is a method of manufacturing a Group III nitride substrate including the steps of (I) forming convex portions by processing a surface of a substrate; (II) growing a Group III nitride layer from upper surfaces of the convex portions to form a seed crystal substrate having gaps formed between the substrate and the Group III nitride layer; (III) bringing a surface of the Group III nitride layer into contact with a melt containing alkali metal and at least one Group III element selected from gallium, aluminum, and indium, in a pressurized atmosphere containing nitrogen, to make the at least one Group III element and the nitrogen react with each other to grow Group III nitride crystals on the Group III nitride layer; and (IV) separating a part including the substrate and a part including the Group III nitride crystals from each other in the vicinities of the gaps.

In this specification, the "Group III nitride" denotes a semiconductor expressed by a composition formula of $Al_xGa_yIn_{1-x-y}N$ (wherein $0 \leq x \leq 1$ and $0 \leq y \leq 1$) unless otherwise specified. In this connection, it is understood that a formula of $0 \leq 1-x-y \leq 1$ is satisfied since the composition ratio can never be a negative value (the same applies to other composition formulae).

According to the manufacturing methods of the present invention, a substrate can be manufactured easily that is formed of high-quality Group III nitride crystals alone and has less warping.

DETAILED DESCRIPTION OF THE INVENTION

Figure 1A:
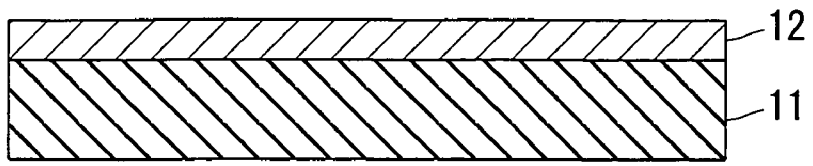
FIGS. 1A to 1F are cross-sectional views showing steps of an example of a manufacturing method according to the present invention.

Hereinafter, the present invention is described in detail.

In the manufacturing methods of the present invention, it is preferable that the at least one Group III element is gallium, and the Group III nitride crystals are GaN crystals.

In the manufacturing methods of the present invention, it is preferable that the atmosphere containing nitrogen is a pressurized atmosphere. The atmosphere is pressurized, for example., in a range of 0.1 MPa to 10 MPa, and preferably in a range of 0.5 MPa to 5 MPa.

It is preferable that in the step (iii) of the first manufacturing method of the present invention, the separation is carried out using stress generated by a difference in coefficient of linear expansion between the substrate and the Group III nitride crystals.

In the first manufacturing method of the present invention, it is preferable that the step (i) includes the steps of: (i-1) forming a first semiconductor layer expressed by a composition formula of $Al_uGa_vIn_{1-u-v}N$ (wherein $0 \leq u \leq 1$ and $0 \leq v \leq 1$), on the substrate; (i-2) forming convex portions by partially removing the first semiconductor layer; and (i-3) forming the Group III nitride layer having gaps in its portions other than the convex portions by growing a second semiconductor layer from upper surfaces of the convex portions of the first semiconductor layer, with the second semiconductor layer being expressed by a composition formula of $Al_xGa_yIn_{1-x-y}N$ (wherein $0 \leq x \leq 1$ and $0 \leq y \leq 1$), wherein in the step (iii), the first semiconductor layer and the second semiconductor layer are separated from each other at the upper surfaces of the convex portions.

Preferably, the upper surfaces are C-planes.

It is preferable that in the step (i-2), the convex portions are formed in stripes.

It is preferable that in the step (i-2), concave portions that are portions other than the upper surfaces of the convex portions are covered with a mask film. Preferable materials used for forming the mask film include silicon nitride, oxide silicon, nitride oxide silicon, aluminum oxide, aluminum nitride oxide, titanium oxide, zirconium oxide, niobium oxide, tungsten, molybdenum, niobium, tungsten silicide, molybdenum silicide, and niobium silicide. They may be used individually, or two or more of them may be used together. It is preferable that the mask film is formed of high melting metal or a high melting metallized material.

In the manufacturing methods of the present invention, it is preferable that the substrate is a sapphire substrate.

In the manufacturing methods of the present invention, it is preferable that the alkali metal is at least one selected from sodium, lithium, and potassium.

In the manufacturing methods of the present invention, it is preferable that the melt further contains alkaline-earth metal.

In the first manufacturing method of the present invention, it is preferable that the step (i) includes the steps of: (i-a) forming a first semiconductor layer expressed by a composition formula of $Al_uGa_vIn_{1-u-v}N$ (wherein $0 \leq u \leq 1$ and $0 \leq v \leq 1$), on the substrate; and (i-b) forming concave portions to be gaps by partially removing the first semiconductor layer to expose portions of the substrate and thereby forming remaining portions into convex portions, wherein in the step (ii), Group III nitride crystals are grown on surfaces of the convex portions formed in the step (i-b).

In the first manufacturing method of the present invention, it is preferable that the step (i) includes the steps of (i-c) forming a mask film patterned on the substrate; and (i-d) forming a first semiconductor layer having a convex shape on each of portions of the substrate that are not covered with the mask film, to allow concave portions to be gaps. The first semiconductor layer can be expressed by a composition formula of $Al_uGa_vIn_{1-u-v}N$ (wherein $0 \leq u \leq 1$ and $0 \leq v \leq 1$). The concave portions are portions where the first semiconductor layer having the convex shape has not been formed. In the step (ii), the Group III nitride crystals are grown on a surface of the first semiconductor layer formed in the step (i-d).

In the first manufacturing method of the present invention, it is preferable that in the step (i), the Group III nitride layer including gaps includes a semiconductor layer expressed by a composition formula of $Al_xGa_yIn_{1-x-y}N$ (wherein $0 \leq x \leq 1$ and $0 \leq y \leq 1$). After forming the semiconductor layer, the gaps are formed in the semiconductor layer or at a surface of the semiconductor layer through a temperature-programmed heat treatment carried out in an atmosphere of a mixture of ammonia and nitrogen. In this case, it is preferable that the Group III nitride layer including gaps is a semiconductor layer expressed by a composition formula of $Ga_xIn_{1-x}N$ (wherein $0 \leq x \leq 1$). Preferably, the temperature-programmed heat treatment is carried out at a programming rate of 50 to 100° C./min.

In the manufacturing methods of the present invention, it is preferable that a cycle of the gaps is at least 30 μm, more preferably at least 50 μm, and further preferably 100 μm. The "gaps" denote spaces observed at a crystal cross section and are spaces (for instance, on the order of sub microns) that can be observed with a scanning electron microscope (SEM) or larger spaces than those. Furthermore, the "cycle of gaps" denotes a distance or a pitch between two gaps adjoining each other when a plurality of gaps are present. This can be measured with, for example, an electron microscope. The "cycle of gaps" also can be expressed by, for instance, a distance (a pitch) between growing points, at the surfaces of the convex portions or the like, from which Group III nitride crystals grow. Furthermore, the cycle of gaps can be adjusted through a suitable selection of a manner of forming the growing points (for example, their size, their positions, or the distance between adjoining two of them).

The Group III nitride substrate of the present invention is a Group III nitride substrate manufactured by a manufacturing method of the present invention.

In the substrate of the present invention, a cycle of dense dislocation areas is preferably at least 30 μm, more preferably at least 50 μm, and further preferably at least 100 μm. The "dense dislocation areas" denote areas where the number of edge dislocations or screw dislocations is at least $10^7$ to $10^8$ per cm$^2$. Examples of the method of determining it include a method in which cathodoluminescence generated by electron beam irradiation is observed and thereby the number of dislocations is determined from the number of dark spots, and a method in which etching is carried out with acid (200° C.) such as, for example, pyrophosphoric acid, and then concavities and convexities are observed by atomic force microscopy (AFM) or the like.

In the substrate of the present invention, a dislocation density is preferably at least $1 \times 10^5$ cm$^{-2}$, more preferably at least $1 \times 10^4$ cm$^{-2}$. The method of determining dislocation density is the same as that of determining the dense dislocation areas, for example a method in which cathodoluminescence generated by electron beam irradiation is observed and thereby the number of dislocations is determined from the number of dark spots, and a method in which etching is carried out with acid (200° C.) such as, for example, pyrophosphoric acid, and then concavities and convexities are observed by atomic force microscopy (AFM) or the like.

A semiconductor device of the present invention includes a substrate and a semiconductor element formed on the substrate, wherein the substrate is a Group III nitride substrate manufactured by a manufacturing method of the present invention. Preferably, the semiconductor element is a laser diode or a light emitting diode.

Hereinafter, embodiments of the present invention are described using examples.

A method of the present invention is a method for manufacturing a Group III nitride substrate. According to this method, a substrate can be manufactured that is formed of Group III nitride semiconductor single crystals alone.

In this method, first, a Group III nitride layer including gaps is formed on a substrate (step (i)). The substrate can be, for example, a sapphire substrate. An example of a method of forming the Group III nitride layer including gaps is described below.

First of all, a first semiconductor layer expressed by a composition formula of $Al_uGa_vIn_{1-u-v}N$ (wherein $0 \leq u \leq 1$ and $0 \leq v \leq 1$) is formed on the substrate (step (i-1)). The first semiconductor layer can be formed by the MOCVD method or a molecular beam epitaxy (MBE) method.

Subsequently, the first semiconductor layer is removed partially to form convex portions (step (i-2)). The convex portions can be formed by a well-known method using photolithography and etching in combination. Usually, the upper surfaces of the convex portions are C-planes. The shape of the convex portions can be a shape that facilitates the separation of the substrate in the step carried out later. The convex portions may be formed, for instance, in stripes or dots. It is preferable that the area of the convex portions does not exceed 50% of the whole area. When being formed in stripes, the convex portions each have a width of, for example, 1 μm to 5 μm, and an interval between two adjacent convex portions is, for instance, 5 μm to 20 μm.

In the step (i-2), it is preferable that portions (concave portions) that are those other than the upper surfaces of the convex portions are covered with a mask film. The mask film can be formed of, for instance, silicon nitride, oxide silicon, nitride oxide silicon, aluminum oxide, aluminum nitride oxide, titanium oxide, zirconium oxide, or niobium oxide. The mask film also may be formed of high melting metal or a high melting metallized material that each have a high melting point (a melting point of at least 1000° C.). Specifically, the mask film may be formed of tungsten, molybdenum, niobium, tungsten silicide, molybdenum silicide, or niobium silicide.

Method of Forming Seed Layer including Gap Layer

Next, the Group III nitride layer having gaps in its portions other than the convex portions is formed by growing a second semiconductor layer from upper surfaces of the convex portions of the first semiconductor layer, with the second semiconductor layer being expressed by a composition formula of $Al_xGa_yIn_{1-x-y}N$ (wherein $0 \leq x \leq 1$ and $0 \leq y \leq 1$) (step (i-3)). The second semiconductor layer may have the same composition as that of the first semiconductor layer or may have a different composition. The second semiconductor layer can be formed by, for instance, the MOCVD method or the MBE method. The second semiconductor layer that is grown from the upper surfaces (C-planes) of the convex portions grows upward as well as in the lateral direction. Accordingly, portions of the second semiconductor layer that have grown from convex portions adjoining each other dock with each other spatially and thereby a bridge structure is formed. In this manner, the Group III nitride layer is formed with gaps formed in its portions other than the convex portions. Using a crystal layer of the Group III nitride semiconductor thus obtained as a seed crystal, crystal growth is carried out in the following step (ii).

Next, in an atmosphere containing nitrogen (preferably, a pressurized atmosphere having 100 atm or lower), a surface of the Group III nitride layer is brought into contact with a melt containing alkali metal and at least one Group III element selected from gallium, aluminum, and indium, to make the at least one Group III element and the nitrogen react with each other and thereby Group III nitride crystals are grown on the Group III nitride layer (step (ii)). The atmosphere containing nitrogen can be, for example, nitrogen gas or a nitrogen gas atmosphere containing ammonia. The alkali metal can be at least one selected from sodium, lithium, and potassium, i.e. one of them or a mixture thereof, which usually is used in a flux state.

The melt is prepared, for instance, by placing a material in a crucible and heating it. After the preparation of the melt, the melt is brought into a supersaturation state and thereby semiconductor crystals grow. Melting of the material and crystal growth are carried out at a temperature of about 700° C. to 1100° C. under a pressure of about 1 atm to 50 atm. The melt further may contain alkaline-earth metal. The alkaline-earth metal can be, for example, Ca, Mg, Sr, Ba, or Be.

According to this method, Group III nitride crystals can be obtained that are expressed by a composition formula of $Al_sGa_tIn_{1-s-t}N$ (wherein $0 \leq s \leq 1$ and $0 \leq t \leq 1$). For instance, when using gallium alone as the Group III element of the material, GaN crystals are obtained, while when using gallium and aluminum as the Group III element of the material, crystals are obtained that are expressed by a composition formula of $Al_sGa_{1-s}N$ (wherein $0 \leq s \leq 1$).

Next, a part including the substrate and a part including the Group III nitride crystals are separated from each other in the vicinities of the gaps (step (iii)). This separation step may be carried out mechanically or using stress generated by a difference in coefficient of linear expansion between the substrate and the Group III nitride crystals. When utilizing the difference in coefficient of linear expansion, the separation can be carried out, for example, in a cooling step (including natural cooling) following the step (ii). When the steps (i-1) to (i-3) described above are carried out, the first semiconductor layer and the second semiconductor layer are separated at the upper surfaces of the convex portions in the step (iii).

In this manner, a substrate formed of Group III nitride crystals alone can be obtained. The example described above was directed to the case where the convex portions are formed in the Group III nitride layer. However, the convex portions may be formed in the substrate. A manufacturing method employed in this case is described below.

In this case, first, a surface of a substrate is processed to form convex portions (step (I)). The substrate can be, for instance, a sapphire substrate whose surface is a C-plane. The concave and convex portions can be formed by, for instance, a photolithography process and dry etching using chlorine gas.

Next, a Group III nitride layer is grown from upper surfaces of the convex portions to form a seed crystal substrate having gaps formed between the substrate and the Group III nitride layer (step (II)). The Group III nitride layer can be formed by the MOCVD method or the MBE method. Using a crystal layer of the Group III nitride semiconductor formed in this step as a seed crystal, crystal growth is carried out in the following steps.

Next, in an atmosphere containing nitrogen, a surface of the Group III nitride layer is brought into contact with a melt containing alkali metal and at least one Group III element selected from gallium, aluminum, and indium, to make the at least one Group III element and the nitrogen react with each other. As a result Group III nitride crystals are grown on the Group III nitride layer (step (III)). Thereafter, a part including the substrate and a part including the Group III nitride crystals are separated from each other in the vicinities of the gaps (step (IV)). Since the steps (III) and (IV) are identical to the steps (ii) and (iii) described above, the descriptions applied to the both are not repeated. In the step (IV), the separation of the substrate is carried out at the upper surfaces of the convex portions of the substrate.

By using a substrate including gaps as a seed crystal, a sapphire substrate can be separated from GaN single crystals. This separation step may be carried out mechanically or using stress generated by a difference in coefficient of linear expansion between the substrate and the Group III nitride crystals. When using the difference in coefficient of linear expansion, the separation can be carried out, for example, in a cooling step (including natural cooling) following the step (III).

In the above-mentioned example, the description was directed to the method in which using a substrate with a Group III nitride layer including gaps formed therein, Group III nitride crystals grown from liquid phase are separated in the vicinities of the gaps. However, the following method also permits the formation of gaps and the separation of Group III nitride crystals.

First, a first semiconductor layer expressed by a composition formula of $Al_uGa_vIn_{1-u-v}N$ (wherein $0 \leq u \leq 1$ and $0 \leq v \leq 1$) is formed on a substrate (step (i-a)). The first semiconductor layer can be formed by, for instance, the MOCVD method or the MBE method.

Next, the first semiconductor layer is removed partially to expose portions of the upper surface of the substrate and thereby convex portions are formed (step (i-b)). The convex portions can be formed by a well-know method using photolithography and etching in combination. Usually, the upper surfaces of the convex portions are C-planes. The shape of the convex portions can be a shape that facilitates the separation of the substrate in the step carried out later. The convex portions may be formed, for instance, in stripes or dots.

In the present example, in an atmosphere containing nitrogen (preferably, a pressurized atmosphere of 100 atm or lower), the surface of the first semiconductor layer is brought into contact with a melt containing alkali metal, the nitrogen and at least one Group III element selected from gallium, aluminum, and indium, to make the at least one Group III element and the nitrogen react with each other. As a result Group III nitride crystals are grown on the upper surfaces of the convex portions of the first semiconductor layer (step (ii)).

In this manner, gaps are formed between the substrate and the Group III nitride crystals. In the present example, since the Group III nitride crystals are grown from liquid phase in the melt containing alkali metal, a Group III element and nitrogen, the lateral growth rate can be increased as compared to the case of vapor growth methods such as a conventional metal organic chemical vapor deposition (MOCVD) method and hydride vapor phase epitaxy (HVPE) method. Accordingly, it is preferable that the area of the convex portions does not exceed 10% of the whole area. When being formed in stripes, the convex portions each have a width of, for example, 1 μm to 5 μm, and an interval between two adjacent convex portions is, for instance, 20 m to 500 μm. A cycle of the convex portions is desirably at least 30 μm, more desirably at least 50 μm, and further desirably at least 100 μm.

Figure 1B:
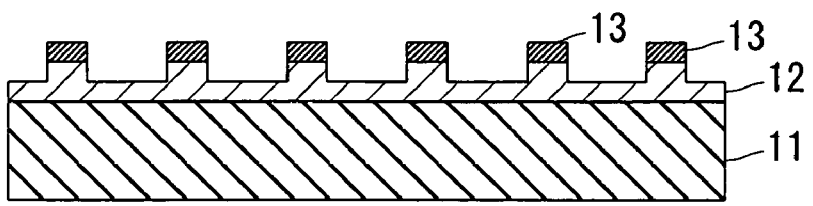
Figure 1C:
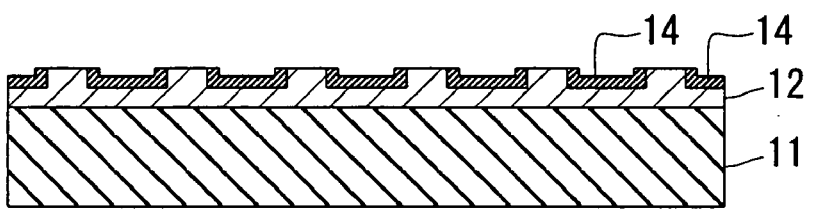
Figure 1D:
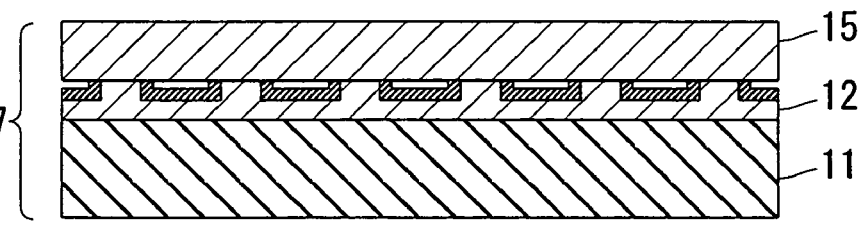

In general vapor growth methods such as the MOCVD method, the MBE method, the HVPE method, etc, since the lateral growth rate is low, docking of crystals growing from the respective convex portions with each other as shown in FIG. 1D is not possible unless the interval between convex portions adjoining each other is set at 20 μm or shorter. Furthermore, the convex portions each is required to have several micrometers to make the crystals grow. Hence, the ratio of a region where the convex portions are formed to a region where the convex portions are not formed is about 20% or higher. In the liquid phase growth method, however, the lateral growth can be promoted and larger single crystals can be made to grow from the convex portions. Hence, the ratio further can be reduced. The reduction in the ratio of the convex portions means a reduction in area where the substrate and crystal portions grown epitaxially from the liquid phase are in contact with each other. Accordingly, the substrate can be separated readily in the vicinities of the gaps. Hence, this provides great practical effects. The cycle of dense dislocation areas is desirably at least 30 μm, more desirably at least 50 μm, and further desirably at least 100 μm.

Next, the substrate and the Group III nitride crystals are separated from each other in the vicinities of the gaps (step (iii)). This separation step may be carried out mechanically or using stress generated by a difference in coefficient of linear expansion between the substrate and the Group III nitride crystals. When using the difference in coefficient of linear expansion, the separation can be carried out, for example, in a cooling step (including natural cooling) following the step (ii).

Moreover, another method described below may be used as the method of forming a semiconductor layer to serve as convex portions on the substrate.

First, a mask film is patterned on a substrate, such as a sapphire substrate (step (i-c)). The mask film can be formed of, for example, silicon nitride, oxide silicon, nitride oxide silicon, aluminum oxide, or aluminum nitride oxide. Furthermore, the mask film may be formed of high melting metal or a high melting metallized material that has a high melting point (a melting point of at least 1000° C.). Specifically, the mask film may be formed of titanium, tungsten, molybdenum, niobium, tungsten silicide, molybdenum silicide, or niobium silicide.

Next, a semiconductor layer expressed by a composition formula of $Al_uGa_vIn_{1-u-v}N$ (wherein $0 \leq u \leq 1$ and $0 \leq v \leq 1$) is formed on portions of the substrate that are not covered with the mask film(step (i-d)). The semiconductor layer can be formed by, for instance, the MOCVD method or the HVPE method.

Using the seed substrate described above, Group III nitride crystals are grown in a melt containing alkali metal and at least one Group III element selected from gallium, aluminum, and indium, in an atmosphere containing nitrogen (step (ii)).

Finally, the substrate and the Group III nitride crystals are separated from each other in the vicinities of the gaps (step (iii)).

Hereinafter, the present invention is described further in detail by means of practicable examples.

EXAMPLE 1

In Example 1, the description is directed to a method including depositing GaN crystals on a sapphire substrate by a metal organic chemical vapor deposition (MOCVD) method, a molecular beam epitaxy (MBE) method, or a HVPE method and then obtaining a GaN-based single crystal substrate by a liquid phase epitaxy (LEP) method. The GaN-based crystal described herein denotes a semiconductor expressed by a composition formula of $Al_sGa_tIn_{1-s-t}N$ (wherein $0 \leq s \leq 1$ and $0 \leq t \leq 1$). In the present example, the description is made with respect to the case of manufacturing a GaN single crystal substrate, as an example. However, for instance, an AlGaN or AlN single crystal substrate also can be manufactured by a similar method.

First, as shown in FIG. 1A, a seed layer 12 of GaN is formed on a sapphire substrate 11 made of sapphire (crystalline $Al_2O_3$) by the MOCVD method. Specifically, the sapphire substrate is heated to have a temperature of about 1020° C. to 1100° C., and then trimethylgallium (TMG) and $NH_3$ are supplied onto the substrate to form the seed layer 12 of GaN. The Group III element contained in the seed layer 12 is not limited to gallium but may be aluminum or indium. That is, the seed layer 12 is not limited as long as it is formed of semiconductor crystals expressed by a composition formula of $Al_uGa_vIn_{1-u-v}N$ (wherein $0 \leq u \leq 1$ and $0 \leq v \leq 1$).

Next, as shown in FIG. 1B, portions of the seed layer 12 located on its upper surface side are etched to form stripe-like convex portions. Specifically, first, a resist film is applied to the upper surface of the seed layer 12 and then the resist film thus applied is patterned into a stripe form by a photolithographic method, thus forming a resist pattern 13. Subsequently, with the resist pattern 13 used as a mask, the seed layer 12 is dry-etched and thereby in the upper part of the seed layer 12 is formed into a cyclic structure in which one cycle consists of a convex portion with a cross-sectional width of about 3 μm and a concave portion with a cross-sectional width of about 12 μm. In order to facilitate the separation of the substrate in a later step, it is preferable that the width of the convex portion is narrow. In the present example, the convex portion is formed to have a stripe structure. However, there is no problem even if it has another structure. For example, a dot structure may be provided as an in-plane structure.

Next, as shown in FIG. 1C, a mask film 14 is formed only in the concave portions. The mask film 14 may cover the whole side wall surfaces of the concave portions or only part of the wall surfaces. The mask film 14 is formed, for example, as follows. First, a thin film made of silicon nitride (SiNx) is deposited to cover the seed layer 12 and the resist pattern 13 using an electron cyclotron resonance (ECR) sputter technique. In this case, solid silicon can be used as a raw material of silicon, nitrogen as a reactive gas, and argon as a plasma gas. In this manner, the formation of the mask film using the ECR sputter technique allows a high-quality mask film to be formed at low temperature. Thereafter, the resist pattern 13 is subjected to lift-off and thereby the resist pattern 13 and the mask film 14 located on the resist pattern 13 are removed, which results in a state where the upper surfaces (C-planes) of the convex portions are exposed.

Next, as shown in FIG. 1D, with the upper surfaces of the convex portions thus exposed to serve as seed crystals, a selective growth layer 15 of GaN crystals is regrown. For example, GaN is formed by a low pressure MOCVD method (26600 Pa (200 Torr), 1050° C.). The selective growth layer 15 grows selectively from the upper surfaces of the convex portions that are not covered with the mask film 14. The selective growth layer 15 grows upward from the upper surface of each convex portion as well as in the direction parallel to the substrate surface (lateral growth). GaN that has grown in the lateral direction from the upper surface of a convex portion docks with GaN that has grown from a convex portion adjacent thereto, spatially (approximately in the middle of the concave portion concerned). Consequently, a bridging structure is formed. This allows the dislocation density to be reduced in the portions that have grown in the lateral direction.

With the selective growth layer 15 grown in such a manner, the respective crystals grown from the upper surfaces of a plurality of convex portions are combined together, and the upper surface thereof is a C-plane. As a result, the seed layer 12 and the selective growth layer 15 form a semiconductor layer including gaps. Consequently, a seed crystal substrate (a bridging structure substrate) 17 is obtained with the semiconductor layer including gaps formed therein. The Group III element contained in the selective growth layer 15 is not limited to gallium but may be aluminum or indium. That is, the selective growth layer 15 is not limited as long as it is formed of semiconductor crystals expressed by a composition formula of $Al_xGa_yIn_{1-x-y}N$ (wherein $0 \leq x \leq 1$ and $0 \leq y \leq 1$).

Figure 1E:
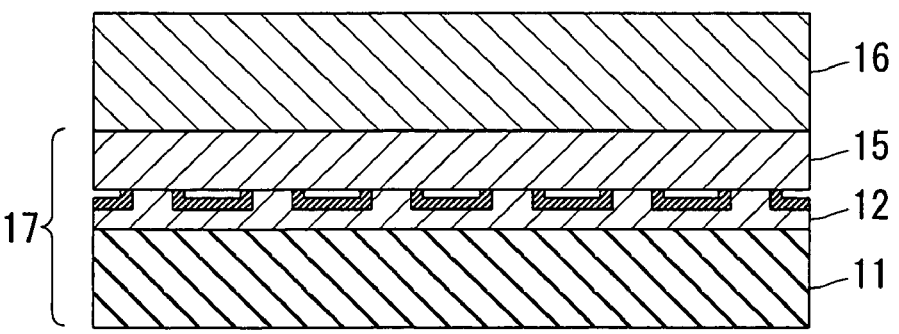
Figure 1F:
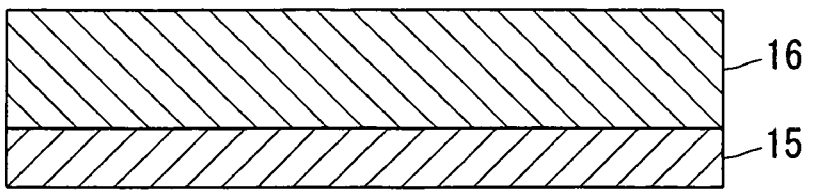

Next, using the seed crystal substrate 17 obtained above, GaN crystals 16 are grown on the selective growth layer 15 by the LPE method (FIG. 1E). Thereafter, a part including the sapphire substrate 11 and a part including the GaN crystals 16 are separated from each other at the upper surfaces of the convex portions (FIG. 1F). In this manner, a substrate is obtained that is formed of GaN crystals alone.

Figures 2A, 2B:
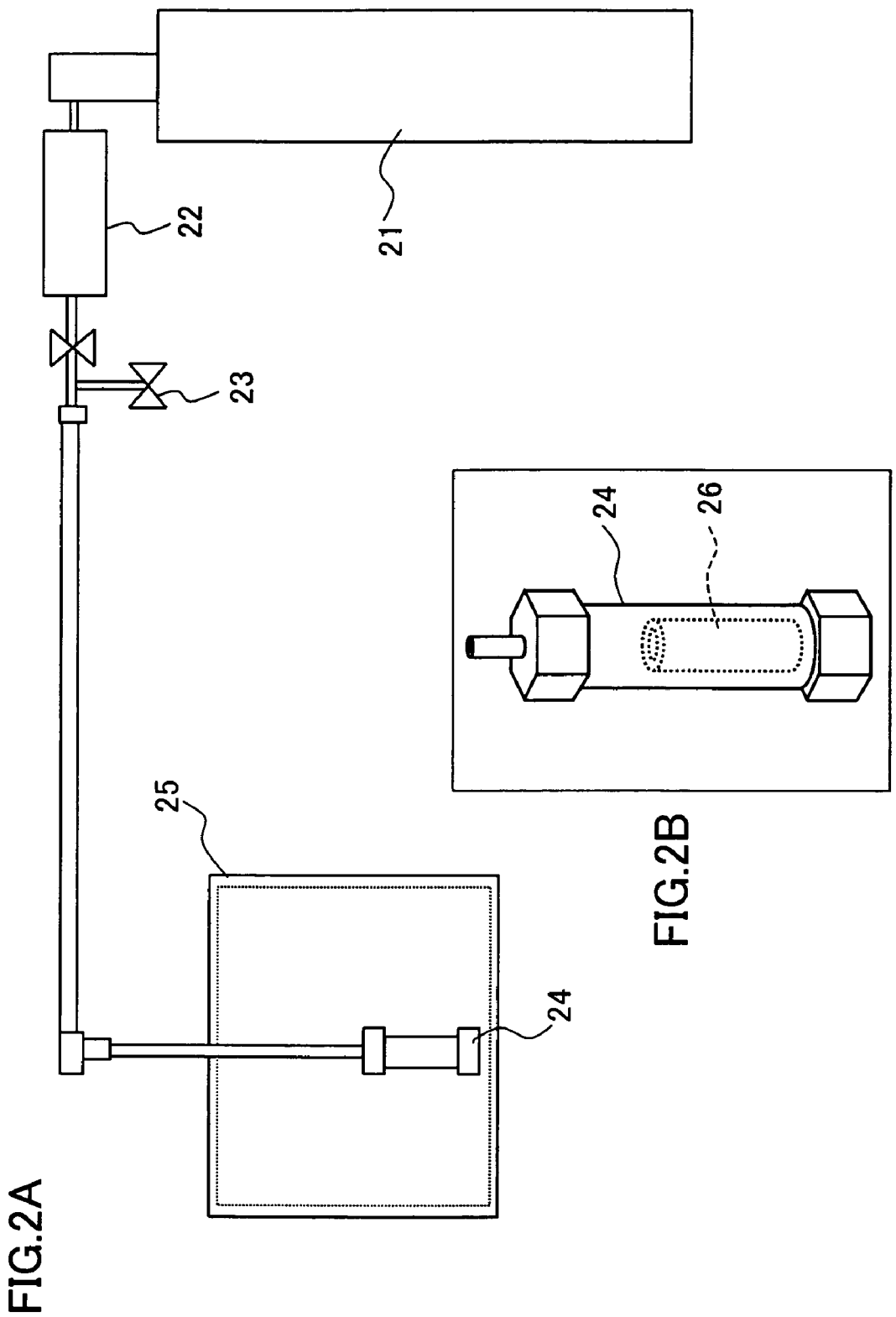
FIGS. 2A and 2B are schematic views showing an example of a manufacturing apparatus used in manufacturing methods of the present invention.

The following description is directed to a method of growing the GaN crystals 16. FIG. 2A shows an example of an LPE apparatus used in this example.

The LPE apparatus shown in FIG. 2A includes: a raw material gas tank 21 for supplying nitrogen gas, or a mixed gas containing ammonia gas ($NH_3$ gas) and nitrogen gas, as a raw material gas; a pressure regulator 22 for regulating the pressure of a growth atmosphere; a leakage valve 23; a stainless steel container 24 used for crystal growth; and an electric furnace 25. FIG. 2B shows an enlarged view of the stainless steel container 24 inside of which a crucible 26 is set. The crucible 26 is made of boron nitride (BN), alumina ($Al_2O_3$), or the like. The crucible 26 can control its temperature within the range of 600° C. to 1000° C. The pressure (100 atm to 150 atm) of the atmosphere supplied from the raw material gas tank 21 can be controlled within the range of not higher than 100 atm by the pressure regulator 22.

A method of growing the GaN crystals is described below. First, normal amounts of Ga and Na serving as a flux were weighed and they were placed inside the crucible 26 together with the seed crystal substrate (i.e. the substrate shown in FIG. 1D). In the present example, the mole ratio of Ga and Na was set at 2.7:7.3. In order to make a comparison, a general seed crystal substrate having no bridging structure (i.e. a substrate with a GaN layer formed on a sapphire substrate) also was set at the same time to be subjected to the crystal growth. Subsequently, the crucible 26 was kept at 800° C. and nitrogen gas containing ammonia (40%) mixed thereinto was supplied at a pressure of 5 atm. Mixing of ammonia into the nitrogen gas can reduce the pressure of the atmosphere in which the crystal growth takes place but is not always required. Even in a nitrogen gas atmosphere free from ammonia, crystals can be grown under a pressure of 50 atm. In this state, while the temperature and pressure were kept constant, the LPE growth was carried out for 96 hours. The GaN crystals 16 thus obtained had a thickness of 100 μm.

The coefficient of linear expansion of sapphire used for the substrate is $7.5 \times 10^{-6}/K$ while that of the GaN that has grown is $5.5 \times 10^{6}/K$. Hence, in a sample obtained through crystal growth carried out using a common seed crystal substrate, the substrate warped considerably at room temperature due to the high growth temperature (for instance, 800° C.). Such warping is a big problem in, for example, a step of mask alignment carried out in a device manufacturing process. On the other hand, in the sample with the GaN crystals grown on the seed crystal substrate (a bridging structure substrate) of the present invention, the substrate was separated at the interface between the seed layer 12 and the selective growth layer 15 when being cooled after the completion of crystal growth. Conceivably, this is caused by the stress generated by the difference in coefficient of linear expansion produced when the substrate is cooled after the completion of crystal growth and the concentration of the stress on the convex portions that is caused due to the small area of the convex portions. In this manner, a GaN single crystal substrate was obtained through the separation of the GaN crystals alone.

The GaN single crystals thus obtained were subjected to electron beam irradiation and thereby the in-plane distribution of cathodoluminescence (CL) was observed. Thus, the dislocation density thereof was evaluated. Dislocation parts are observed as black spots due to the low emission intensity thereof. The GaN single crystals obtained in the present example had a low dislocation density, specifically, $1 \times 10^2$ cm$^{-2}$ or lower. On the other hand, the seed layer 12 disposed on the sapphire substrate 11 had a high dislocation density, specifically, $5 \times 10^9$ cm$^{-2}$. Thus, growing the GaN single crystals by the method of the present example permitted the dislocation density of the crystals to be reduced.

The dislocation density of $1 \times 10^2$ cm$^{-2}$ or lower is low and comparable to that of a GaAs substrate used in manufacturing semiconductor lasers for reading/writing information on/from CDs or DVDs. Hence, it is considered that according to the example described above, a GaN single crystal substrate was obtained that had sufficient characteristics for manufacturing semiconductor lasers having a lifetime of at least 10000 hours.

Figure 3A:
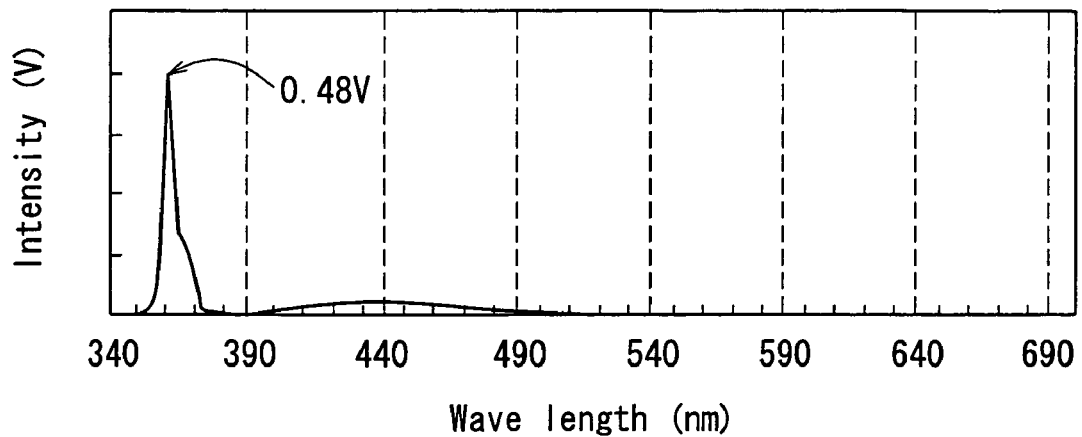
FIG. 3A is a graph showing PL intensity of a GaN crystal obtained by a conventional method.
Figure 3B:
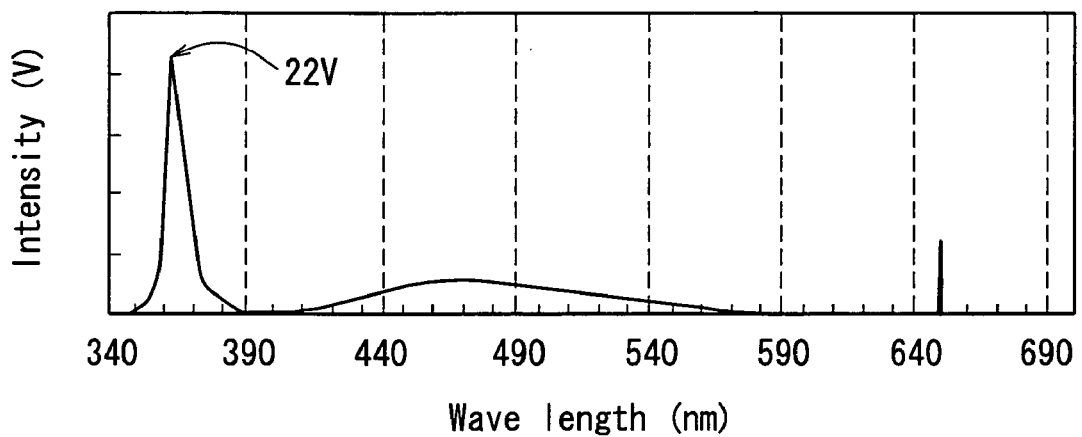
FIG. 3B is a graph showing PL intensity of a GaN crystal obtained in one example of the present invention.

GaN crystals were produced by the method described above and then were subjected to measurements of dislocation density and PL intensity. They had a dislocation density of $1 \times 10^2$ cm$^{-2}$ or lower. The spectrum of the PL intensity is shown in FIG. 3B. The intensity obtained at the peak around 360 nm of the spectrum shown in FIG. 3B was 22 V. FIG. 3A shows the PL intensity of a GaN thin film produced by a general MOCVD method for comparison. In this connection, FIGS. 3A and 3B show spectrums measured with slits having different widths from each other, respectively. The peak intensity obtained around 360 nm of the spectrum shown in FIG. 3A was 0.48 V. The crystals obtained by the method of the present invention had a PL intensity that was about fifty times as high as that of the crystals produced by a conventional method.

In the present example, the description was directed to the manufacture of a GaN single crystal substrate using gallium. However, it is desirable to manufacture a substrate having low absorptivity with respect to a wavelength used in an optical device to be formed on the substrate. Hence, it is preferable that a substrate for a light emitting diode or a semiconductor laser handling light within the ultraviolet region is formed of $Al_xGa_{1-x}N$ (wherein $0 \leq x \leq 1$) single crystals that contain a large amount of Al and have low absorptivity with respect to light with short wavelengths. In the present invention, it also is possible to substitute a part of Ga by another Group III element to form such Group III nitride semiconductor single crystals.

Figure 4:
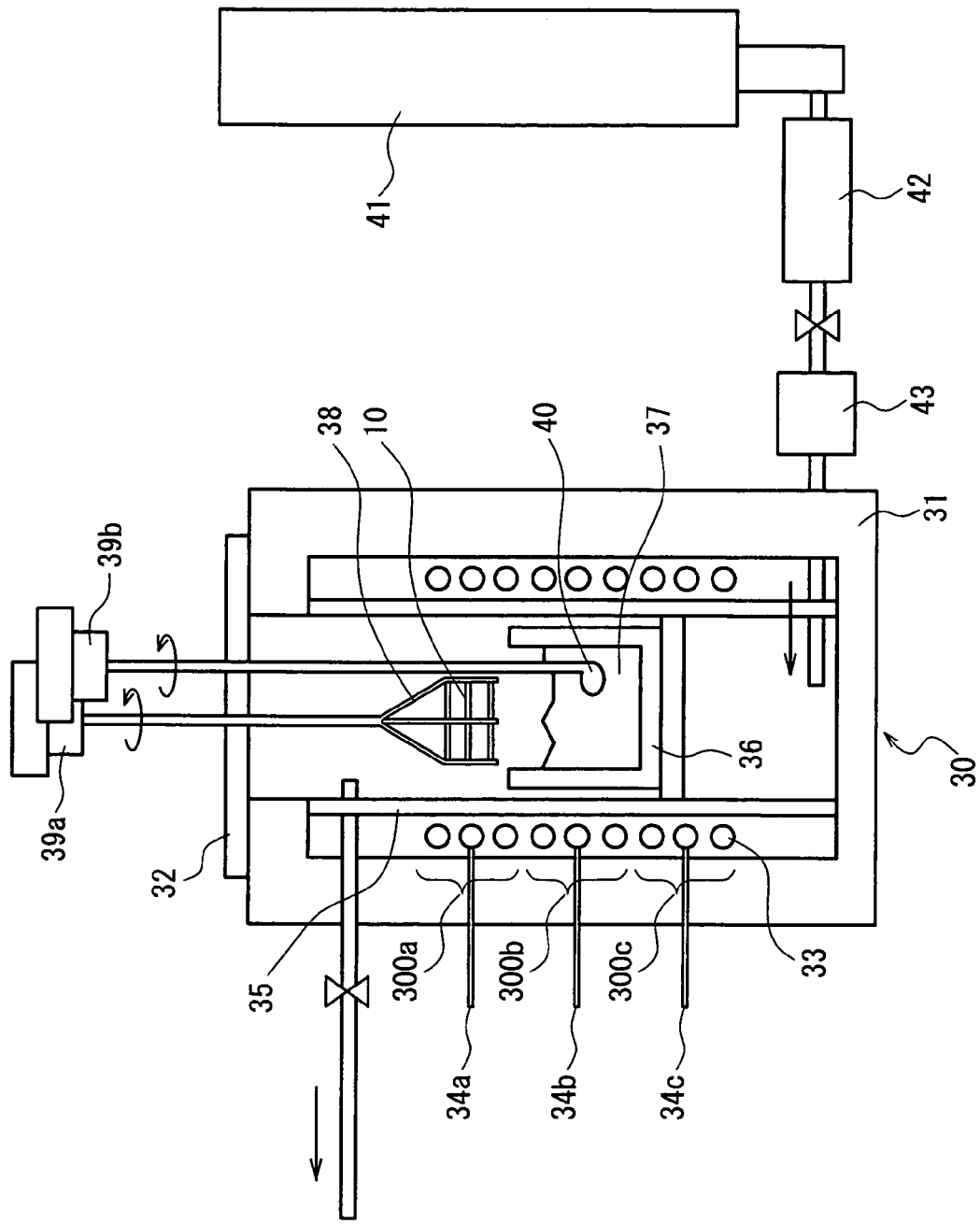
FIG. 4 is a schematic view showing another example of a manufacturing apparatus used in the manufacturing method of the present invention.

In the above-mentioned example, the GaN single crystal substrate was manufactured using a simple growth apparatus. However, it also is possible to manufacture substrates using a large growth apparatus in order to manufacture higher quality substrates. FIG. 4 shows an example of the LPE apparatus used in such a case.

The LPE apparatus shown in FIG. 4 includes an electric furnace 30 composed of a chamber 31 made of stainless steel and a furnace cover 32. The LPE apparatus is constructed to bear a pressure of 10 atm. Inside the chamber 31 are disposed heaters 33. The chamber 31 is composed of three zones that are zones 300a, 300b, and 300c provided with thermocouples 34a, 34b, and 34c, respectively. The three zones are controlled so as to keep their temperature within a range of ±0.1° C., and thereby the temperature inside the furnace is controlled to be uniform. A core tube 35 is provided to improve the uniformity of the temperature inside the furnace and to prevent impurities from being introduced from the heaters 33.

Inside the core tube 35 is disposed a crucible 36 made of boron nitride (BN). A material is placed inside the crucible 36 and the temperature of the crucible 36 is raised to prepare a melt 37. A substrate 10 to serve as a seed crystal is attached to a substrate holding member 38. In the apparatus shown in FIG. 4, a plurality of substrates 10 can be attached to the substrate holding member 38. The substrate 10 is rotated by a rotary motor 39a. A stirring propeller 40 can be immersed in the melt 37. The propeller 40 is rotated by a rotary motor 39b. In the present example, a common rotary motor can be used since the atmosphere pressure is 10 atm or lower. However, an electromagnetic induction rotary mechanism may be used under an atmosphere pressure exceeding 10 atm. Atmosphere gas (raw material gas) is supplied from a gas source 41. The pressure of the atmosphere gas is adjusted by a pressure regulator 42. The atmosphere gas is fed into the furnace after impurities are removed therefrom by a gas purification unit 43.

The following description is directed to a method of growing crystals.

(1) First, predetermined amounts of Ga and Na to serve as a flux are weighed and then are placed inside a crucible. As Ga there is used a material with a purity of 99.9999% (six nine). As Na there is used purified Na. Na can be purified as follows: Na is heated to melt in a glove box, the inside of which has been subjected to He substitution, and then for example, oxides emerging on the surface layer are removed. Alternatively, Na may be purified by zone refining. The purity of Na can be increased by melting and solidifying Na repeatedly in a tube to allow impurities to deposit and then removing them.

(2) In order to melt the raw material placed inside the crucible, the temperature inside the electric furnace is raised to 900° C. and thereby a melt of the raw material is prepared.

In this stage, the seed crystal substrate is not placed inside the crucible. In order to mix Ga and Na, the melt is stirred for several hours with the propeller being immersed in the melt. The atmosphere gas is, for instance, nitrogen gas or that containing ammonia. The pressure of the nitrogen gas is set at about 1 atm to prevent Ga and Na from reacting with nitrogen gas at this stage. When ammonia is contained, the reaction occurs at lower pressure. Hence, it is preferable that the nitrogen gas alone is used for the atmosphere gas at this stage.

(3) Next, the temperature of the crucible is set at 800° C. to bring the melt into a supersaturation state. In addition, the atmosphere pressure is increased. In the present example, the atmosphere is, for example, nitrogen gas alone and is set at 50 atm. Subsequently, the seed crystal substrate is lowered to the position just above the surface of the melt and its temperature is made to approach the temperature of the melt. After several minutes, the seed crystal substrate is put into the melt to allow GaN crystals to start growing.

(4) During the crystal growth, the substrate is rotated at a rotational speed in a range of 10 rpm to 200 rpm. Desirably, the substrate is rotated at around 100 rpm. After the crystals are grown for 24 hours, the substrate is lifted to be taken out from the melt. After being lifted, the substrate is rotated at a speed of 300 rpm to 1500 rpm in order to remove the melt remaining on the substrate surface. Desirably, the substrate is rotated at around 1000 rpm. Thereafter, the substrate is taken out of the chamber. During the crystal growth, the temperature of the crucible may be kept constant. However, the temperature of the melt may be lowered at a constant rate to keep the supersaturation of the melt constant.

In the present example, since the seed crystal substrate having a bridging structure is used, the GaN substrate separates from the convex portions of the seed crystal substrate upon cooling the substrate. Consequently, a flat GaN single crystal substrate was obtained with no warping caused therein.

The substrate thus obtained was evaluated and as a result, its dislocation density was $1\times10^2$ cm$^{-2}$ or lower. Furthermore, the PL intensity of the substrate thus obtained was about 50 times as high as that of a GaN thin film manufactured by a general MOCVD method.

In the present example was used a flux containing Na alone. However, similar effects can be obtained even when using a mixed flux containing alkaline-earth metal such as, for example, Ca and a Li, Na, or K flux. For instance, when using a mixed flux containing Na and Ca, the Ca mixed to account for about 10% of the whole allows crystals to grow at lower pressure.

According to the present invention, a GaN single crystal substrate that includes no sapphire substrate, is not warped, and has a low dislocation density can be manufactured with high mass-productivity. Accordingly, a substrate that permits a highly reliable device to be manufactured can be supplied at low cost. Particularly, its characteristics that no warping is caused and the dislocation density is low over the whole area simplify the process of manufacturing devices such as semiconductor lasers or the like and also allow devices to be manufactured with a high yield.

EXAMPLE 2

Figure 5:
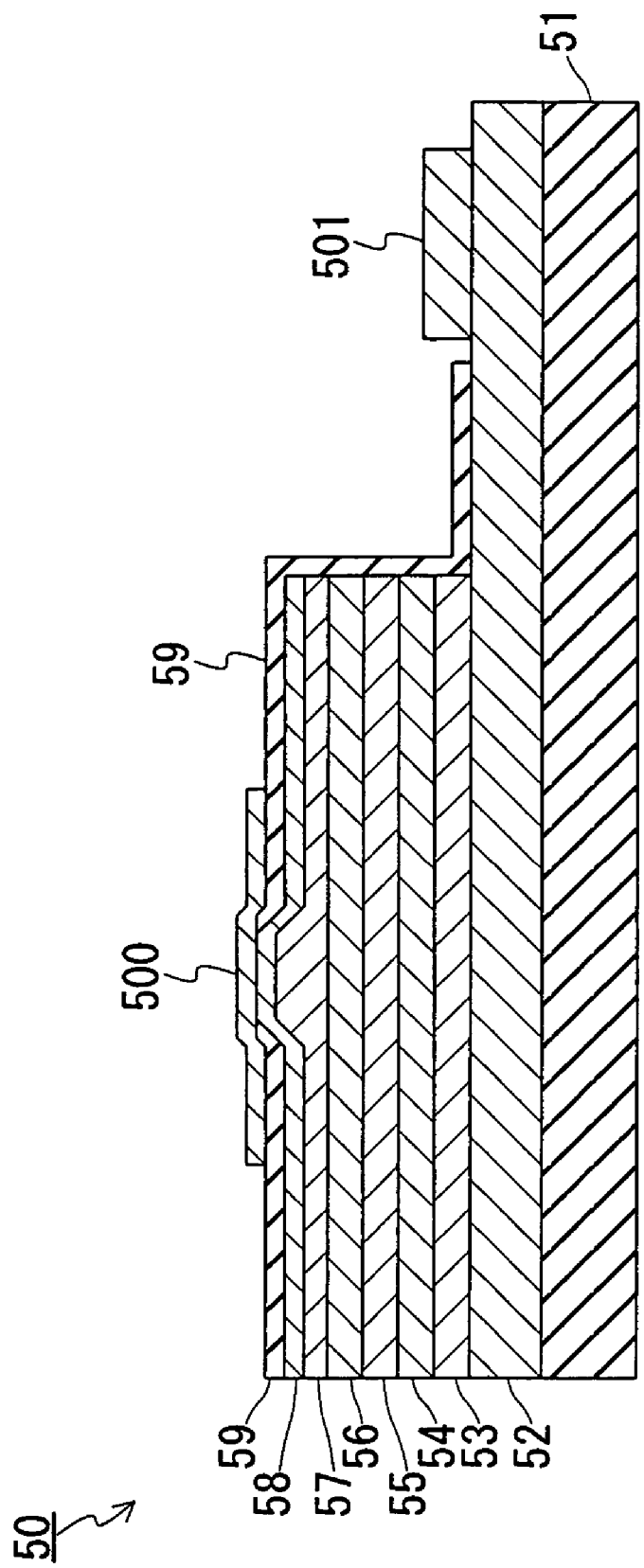
FIG. 5 is a cross-sectional view showing an example of a semiconductor device including a substrate manufactured by a manufacturing method of the present invention.

In Example 2, the description is directed to an example of manufacturing a semiconductor laser using the substrate obtained in Example 1. The configuration of a semiconductor laser 50 is shown in FIG. 5.

First, on a substrate 51 obtained in the above-mentioned example is formed a contact layer 52 of n-type GaN doped with Si to have a carrier density of $5\times10^{18}$ or lower. The substrate 51 is one with Group III nitride crystals formed on sapphire or one formed of Group III nitride crystals. In GaN-based crystals (crystals containing Ga and N), when Si is added thereto as an impurity, holes present in Ga increase in number. Since the holes present in Ga diffuse easily, they have harmful effects in terms of, for example, lifetime when a device is formed on the contact layer. Hence, the doping amount may be controlled so that the contact layer has a carrier density of $3\times10^{18}$ or lower.

Next, on the contact layer 52 are formed a cladding layer 53 of n-type $Al_{0.07}Ga_{0.93}N$ and a light guiding layer 54 of n-type GaN. Subsequently, as an active layer 55 is formed a multiple quantum well (MQW) composed of a well layer (with a thickness of about 3 nm) made of $Ga_{0.8}In_{0.2}N$ and a barrier layer (with a thickness of about 6 nm) made of GaN. Thereafter, on the active layer 55 are formed sequentially a light guiding layer 56 of p-type GaN, a cladding layer 57 of p-type $Al_{0.07}Ga_{0.93}N$, and a contact layer 58 of p-type GaN. These layers can be formed by well-known methods. The semiconductor laser 50 is of a double-hetero junction type. The energy gap of the well layer containing indium in the MQW active layer is smaller than those of the n-type and p-type cladding layers containing aluminum. On the other hand, the highest optical refractive index is obtained in the well layer of the active layer 55, while the light guiding layers and the cladding layers have optical refractive indices decreased in this order.

On the contact layer 58 is formed an insulating film 59 forming a current injection region having a width of about 2 μm. A ridge part to serve as a current constriction part is formed in the upper portion of the p-type cladding layer 57 and the p-type contact layer 58.

On the upper side of the p-type contact layer 58 is formed a p-side electrode 500 that is in ohmic contact with the contact layer 58. The p-side electrode 500 may be formed of a layered product of nickel (Ni) and gold (Au).

On the n-type contact layer 52 is formed an n-side electrode 501 that is in ohmic contact with the contact layer 52. The n-side electrode 501 may be formed of a layered product of titanium (Ti) and aluminum (Al).

The semiconductor laser produced by the method described above was subjected to a device evaluation. When predetermined forward voltage was applied to between the p-side electrode and the n-side electrode of the semiconductor laser obtained in the above, positive holes and electrons are injected into the MQW active layer from the P-side electrode and the n-side electrode, respectively, to be recombined with each other in the MQW active layer and thereby an optical gain was produced. Consequently, the semiconductor laser generated oscillation with an emission wavelength of 404 nm.

In the semiconductor laser of the present example, a substrate with a low dislocation density, specifically, $1\times10^2$ cm$^{-2}$ or lower, was used as its substrate. Accordingly, the semiconductor laser had a lower threshold, improved luminous efficiency, and improved reliability as compared to one produced on a GaN substrate with a high dislocation density.

Effects obtained when LDs or LEDs are manufactured using the substrate obtained according to the present invention are described as follows. The sapphire substrate can be removed and thereby a GaN single crystal substrate with no warping and a low dislocation density is used. This allows, for example, mask alignment to be carried out easily and accurately in a LD manufacturing process. Consequently, highly reliable LDs can be manufactured with a high yield. Furthermore, since the use of the GaN single crystal substrate with no warping and a low dislocation density reduces the effect causing distortion of a device, the reliability of the device can be improved. Since the dislocation density is low over the entire area of the substrate, high reliability can be obtained in wide-stripe LDs. Moreover, the use of the GaN substrate makes cleavage possible and thereby the dry etching step is no longer necessary. Consequently, the manufacturing process can be simplified and thus devices can be manufactured at low cost.

EXAMPLE 3

Figure 6A:
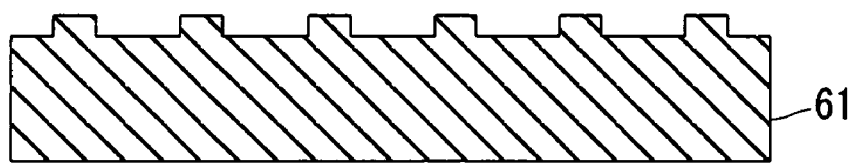
FIGS. 6A to 6C are cross-sectional views showing steps of another example of a manufacturing method according to the present invention.

In Example 3, the description is directed to an example of a method of forming concavities and convexities in a substrate. First, as shown in FIG. 6A, concave and convex portions to form gaps are formed on a sapphire substrate 61 made of sapphire (crystalline $Al_2O_3$) having a (0001) plane. A stripe resist pattern is formed by photolithography and then the concave and convex portions are formed by dry-etching using chlorine gas.

Figure 6B:
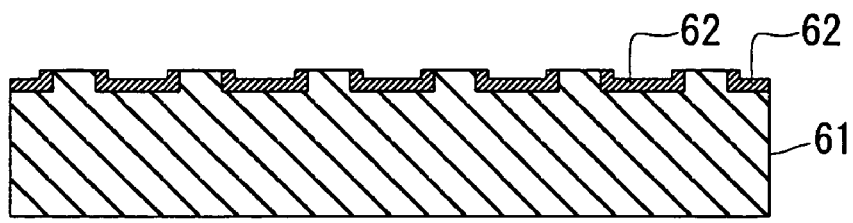
Figure 6C:
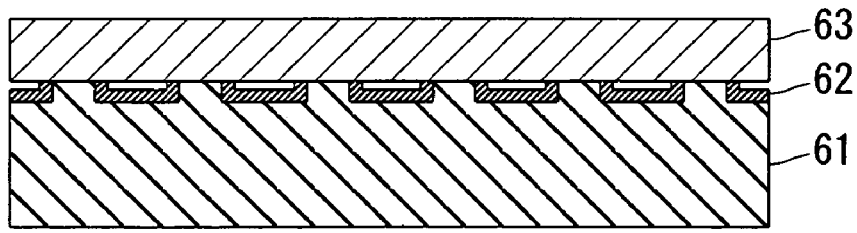

Next, as shown in FIG. 6B, a SiNx film 62 is formed only in the concave portions to be gaps. Specifically, first, a resist pattern is formed on the convex portions, and then a thin film made of silicon nitride (SiNx) is deposited using an electron cyclotron resonance (ECR) sputter technique. By lift-off of the resist pattern, a SiNx film is formed in the concave portions.

Subsequently, a seed layer 63 of GaN is formed on the convex portions of the sapphire surface by the MOCVD method. Specifically, after the sapphire substrate is heated to have a temperature of about 1020° C. to 1100° C., trimethylgallium (TMG) and $NH_3$ are supplied onto the substrate to form the seed layer of GaN. In this connection, the Group III element of the seed layer is not limited to gallium but may be aluminum or indium. In other words, any seed layer can be used as long as it is formed of semiconductor crystals expressed by a composition formula of $Al_uGa_vIn_{1-u-v}N$ (wherein $0 \leq u \leq 1$ and $0 \leq v \leq 1$). With the crystal layer of the Group III nitride semiconductor thus obtained used as a seed crystal, crystal growth is carried out.

Example 4

In Example 1, the GaN single crystals were formed on a seed crystal substrate having a bridging structure by the LPE method using a flux. However, the substrate having a bridging structure also can be utilized as a seed crystal used for growing crystals by a sublimation method. An example of the crystal growing apparatus used in this case is shown in FIG. 7.

Figure 7:
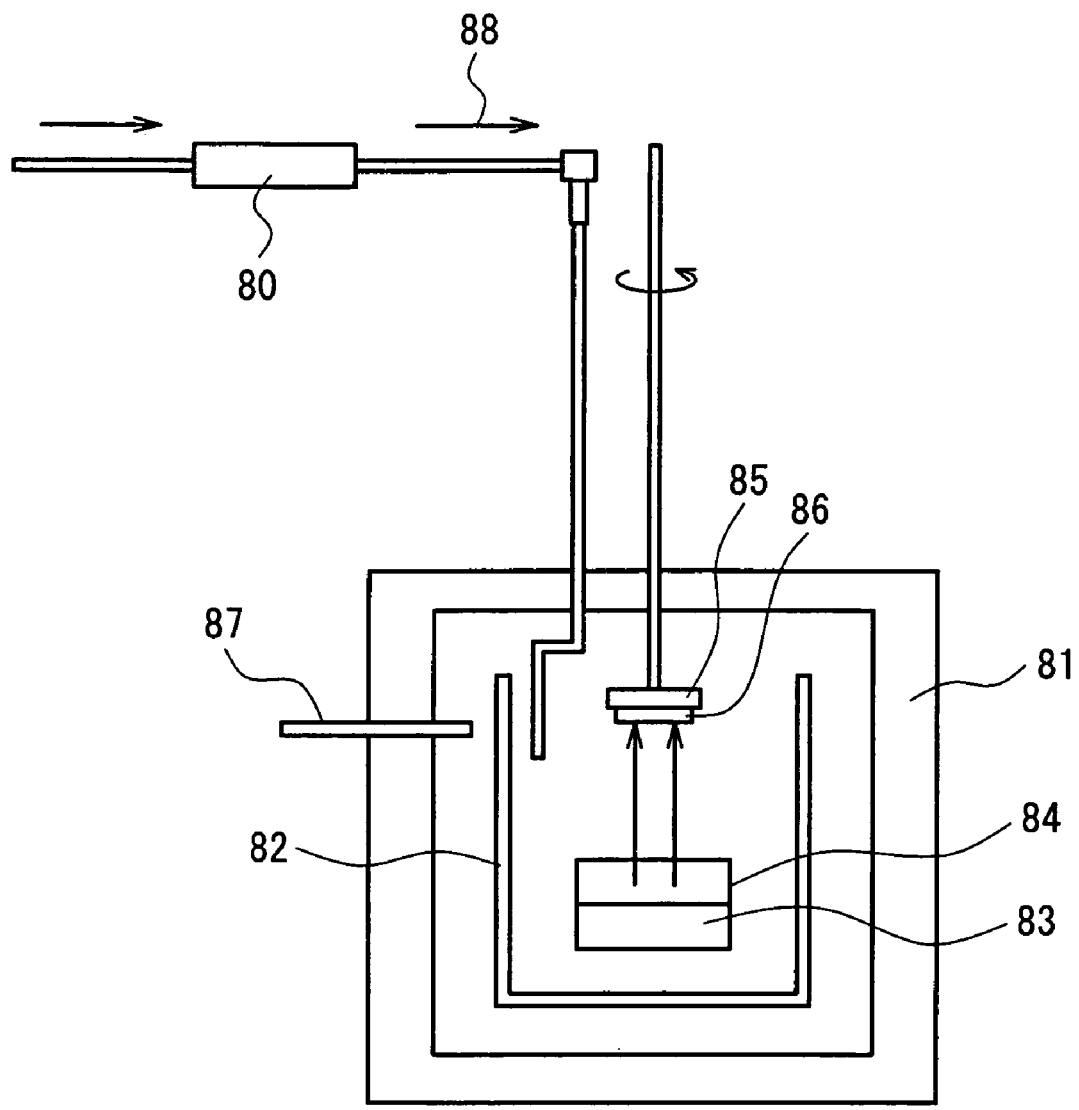
FIG. 7 is a schematic view showing still another example of a manufacturing apparatus used in a manufacturing method of the present invention.

The crystal growing apparatus shown in FIG. 7 includes a flow-controller 80, an electric furnace 81, and a thermocouple 87. Inside the electric furnace 81 is disposed a silica tube 82 in which a crucible 84 made of boron nitride (BN) is placed with GaN powder 83 contained therein. Nitrogen gas containing $NH_3$ gas is supplied from the direction indicated with an arrow 88 in FIG. 7 and the atmosphere inside the electric furnace 81 is adjusted by the flow-controller 80 so as to be a nitrogen gas atmosphere containing about 10 vol. % of $NH_3$ gas. When the temperature of the crucible 84 is raised, the GaN powder 83 reacts with the nitrogen gas ($NH_3$ gas) to be decomposed and springs out upward to adhere onto the substrate 86 that has been heated by a substrate heater 85. For a substrate to be placed on the substrate heater 85 there is used the seed crystal substrate having a bridging structure described in Example 1. After GaN single crystals were grown on the GaN seed crystal substrate, the temperature inside the electric furnace was lowered and the temperature of the substrate heater also was lowered. As a result, the GaN single crystals that had grown were separated from the sapphire substrate due to the difference in coefficient of linear expansion between the sapphire substrate and the GaN crystals.

The pressure of the electric furnace is preferably 1 atm or higher. As an increase of the pressure in the electric furnace causes a rise of the decomposition temperature of GaN and facilitates the decomposition of GaN in the crucible and production of GaN on the substrate, GaN crystals can be grown stably on the substrate.

In the method of the example described above, a C-plane $Al_xGa_{1-x}N$ (wherein $0 \leq x \leq 1$) substrate can be used as a seed crystal. However, the use of an $Al_xGa_{1-x}N$ (wherein $0 \leq x \leq 1$) substrate having another orientation, as a seed crystal substrate also makes it possible to obtain a single crystal substrate expressed by a composition formula of $Al_xGa_{1-x}N$ (wherein $0 \leq x \leq 1$). For example, when with an A-plane GaN substrate used as a seed crystal, a light-emitting diode is formed using the single crystal substrate obtained, no piezoelectric effect is produced. Consequently, positive holes and electrons can be recombined efficiently and thereby the luminous efficiency can be improved.

Using a substrate obtained by a manufacturing method of the present invention, Group III nitride crystals are grown epitaxially on the substrate, and thereby a semiconductor device is obtained that includes a semiconductor element such as, for example, an LD or LED.

EXAMPLE 5

Figure 8A:
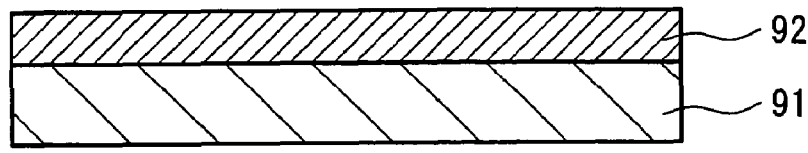
FIGS. 8A to 8D are cross-sectional views showing steps of a further example of a manufacturing method according to the present invention.

First, as shown in FIG. 8A, a seed layer 92 of GaN is formed on a sapphire substrate 91 made of sapphire (crystalline $Al_2O_3$) by the MOCVD method. Specifically, the sapphire substrate 91 is heated to have a temperature of about 1020° C. to 1100° C. Thereafter, trimethylgallium (TMG) and $NH_3$ are supplied onto the substrate to form the seed layer 92 of GaN. The Group III element of the seed layer 92 is not limited to gallium but may be aluminum or indium. That is, the seed layer 92 may be any layer as long as it is formed of semiconductor crystals expressed by a composition formula of $Al_uGa_vIn_{1-u-v}N$ (wherein $0 \leq u \leq 1$ and $0 \leq v \leq 1$).

Figure 8B:
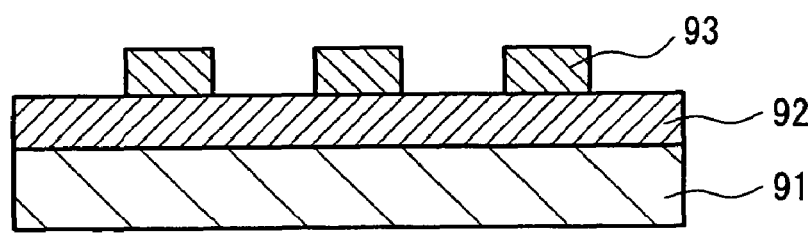
Figure 8C:
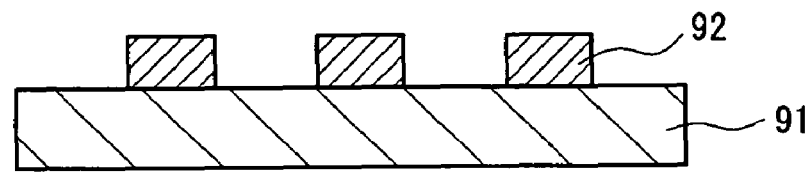

Next, as shown in FIG. 8B, the seed layer 92 is etched partially up to the sapphire substrate 91 to form stripe convex portions. Specifically, first, after a resist film 93 is applied to the upper surface of the seed layer 92, the resist film 93 thus applied is patterned into stripes by a photolithographic method to form a resist pattern. Subsequently, with the resist pattern used as a mask, the seed layer 92 is dry-etched. Consequently, as shown in FIG. 8C, convex portions with a width of about 5 μm are formed at a cycle of about 300 μm. The convex portions each are formed of a stripe structure in the present example. However, there is no problem even if the convex portions have other structures. For instance, dot-like structures may be provided as in-plane structures.

Figure 8D:
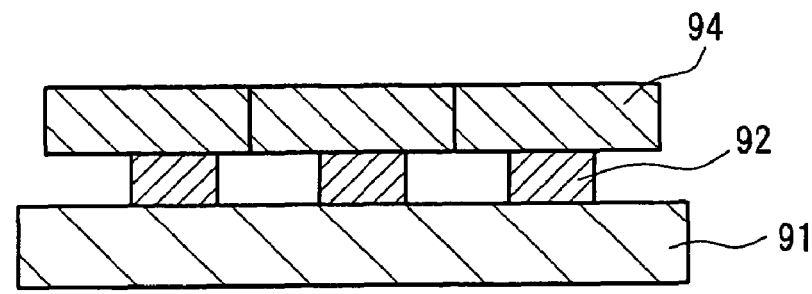

Next, as shown in FIG. 8D, LPE-GaN crystals 94 each formed of a GaN crystal are grown through liquid phase growth, with the upper surfaces of the convex portions used as seed crystals. The liquid phase growth was carried out using the LPE apparatus shown in FIGS. 2A and 2B. Sodium and gallium were weighed and then were placed inside the crucible into which a template shown in FIG. 8C was inserted. Crystals were grown in a nitrogen pressurized atmosphere with a pressure of 50 atm at 800° C. for 100 hours. Consequently, the LPE-GaN crystals shown in FIG. 8D were grown. In the liquid phase growth, since the growth rate in the lateral direction is faster, the LPE-GaN crystals that grew from the convex portions adjoining each other coalesced as shown in FIG. 8D.

In the present example, the area where the convex portions and the LPE-GaN crystals are in contact with each other is small. Hence, when a melt was cooled, the LPE-GaN crystals were separated easily in the vicinities of the gaps. Furthermore, in the LPE-GaN crystals thus obtained, a great deal of dislocations were observed in their portions that had been located on the convex portions and coalescence portions, but in the other portions fewer dislocations were observed. In the present invention, since the cycle of the convex portions is 300 μm, a region with less dislocations can be obtained in a wide area, specifically, at least 100 μm. Accordingly, when, for example, a semiconductor laser is manufactured, the precision required in mask alignment carried out for forming a waveguide can be eased. In addition, a waveguide of a wide stripe required for a high-power semiconductor laser can be formed. Hence, great practical effects are provided.

Figure 9A:
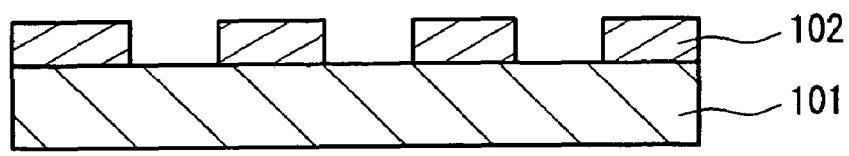
FIGS. 9A to 9C are cross-sectional views showing steps of still another example of a manufacturing method according to the present invention.

Furthermore, as another example, even when using a template shown in FIG. 9A, similar LPE-GaN crystals can be formed.

As shown in FIG. 9A, first, SiNx (silicon nitride) to form a mask film 102 is grown on a sapphire substrate 101 to have a thickness of 100 nm by an atmospheric CVD method. Subsequently, stripe windows (portions where the sapphire substrate is exposed) are formed in the mask film by photolithography and etching. The windows may be in the form of dot. The mask film thus left had a width of 10 μm and was formed at a cycle of 500 μm.

Figure 9B:
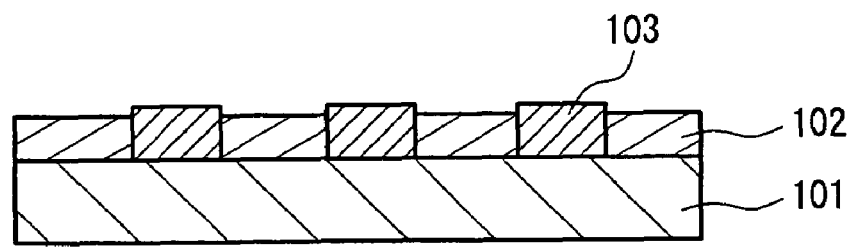

Next, as shown in FIG. 9B, on the portions of the sapphire substrate that are not covered with the mask film 102 a seed layer 103 expressed by a composition formula of $Al_uGa_vIn_{1-u-v}N$ (wherein $0 \leq u \leq 1$, $0 \leq v \leq 1$, and $u+v \leq 1$) is formed by the MOCVD method. In this example, after the sapphire substrate is heated to have a temperature of about 1020° C. to 1100° C., trimethylgallium (TMG) and $NH_3$ are supplied onto the substrate to grow the seed layer.

Figure 9C:
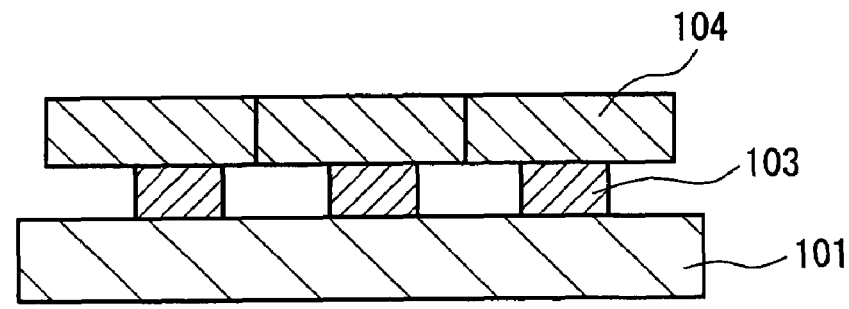

Next, as shown in FIG. 9C, LPE-GaN crystals 104 each formed of a GaN crystal are grown on the seed crystals through liquid phase growth. The liquid phase growth was carried out using the LPE apparatus shown in FIGS. 2A and 2B.

Similarly, in the present example, the area where the convex portions and the LPE-GaN crystals were in contact with each other was small. Hence, when the melt was cooled, the LPE-GaN crystals were separated easily in the vicinities of the gaps. Furthermore, in the LPE-GaN crystals thus obtained, a great deal of dislocations were observed in their portions that had been located on the convex portions and coalescence portions, but in the other portions fewer dislocations were observed. Hence, when, for example, a semiconductor laser is manufactured, the precision required in mask alignment carried out for forming a waveguide can be eased. In addition, a waveguide of a wide stripe required for a high-power semiconductor laser can be formed. Consequently, great practical effects are provided.

EXAMPLE 6

Figure 10A:
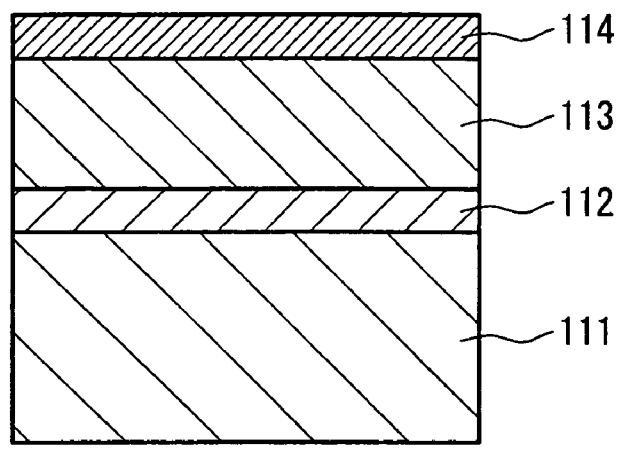
FIGS. 10A to 10C are cross-sectional views showing steps of yet another example of a manufacturing method according to the present invention.
Figure 10B:
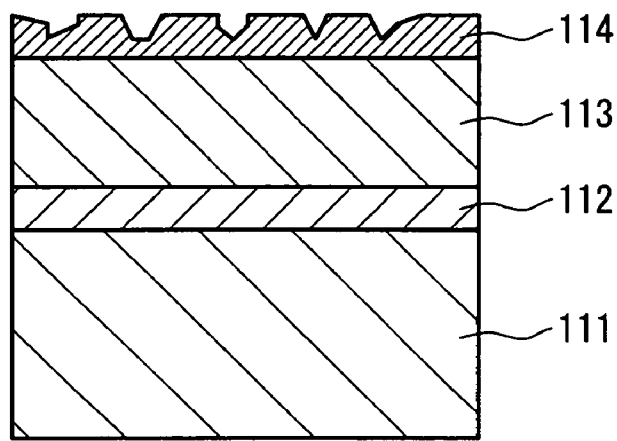
Figure 10C:
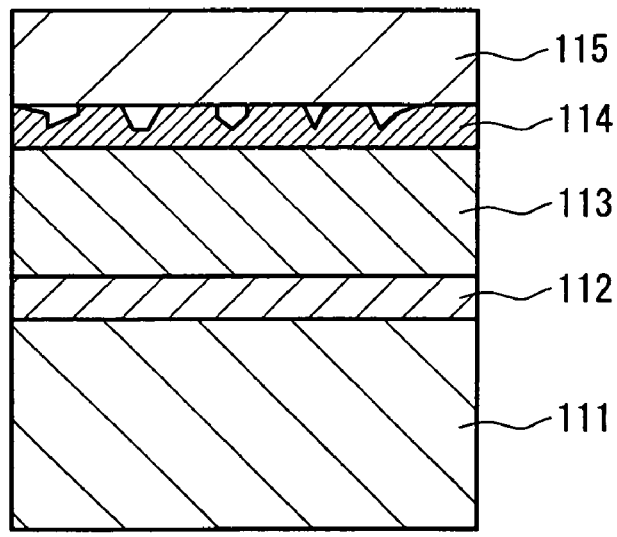

As shown in FIGS. 10A to 10C, crystal growth is carried out using a metalorganic vapor phase epitaxy (MOVPE) method. That is, prior to vapor phase growth, a sapphire C-plane substrate 111 is placed on a susceptor located inside a reactor and is heated in a hydrogen atmosphere of 200 Torr at 1050° C. for 15 minutes after the reactor is evacuated of air, and thereby the substrate surface is cleaned.

Subsequently, after the substrate is cooled to 600° C., trimethylgallium (TMG) is allowed to flow at 20 μmol/min, ammonia at 2.5 L/min, carrier hydrogen and nitrogen each at 2 L/min. As a result, a GaN buffer layer 112 is deposited in a polycrystalline state to have a thickness of 20 nm as shown in FIG. 10A. In this case, the optimum deposition temperature is 500° C. to 600° C.

Next, only the supply of TMG is stopped and the substrate temperature is raised to 1090° C. Thereafter, TMG is supplied again to form a GaN single crystal layer 113 with a thickness of about 1 μm. It is desirable that the thickness is at least 0.5 μm in order to improve the c-axis orientation. A preferable growth temperature range is higher than 1000° C. but not higher than 1200° C.

Next, the supply of TMG and hydrogen is stopped, and then the substrate temperature is lowered to 800° C. in an atmosphere of a mixture of ammonia and nitrogen to allow the substrate to have a constant temperature. Thereafter, trimethylindium (TMI) and TMG are supplied at 200 μmol/min and 20 μmol/min, respectively, to deposit an InGaN layer 114 having a thickness of 100 nm. The mole fraction of In contained in the InGaN mixed crystals is about 10%. It is possible to adjust the mole fraction of In contained in the InGaN mixed crystals by adjusting the mole fractions of TMI and TMG to be supplied.

Subsequently, the supply of TMI and TMG is stopped and the substrate temperature is raised from 800° C. to 1090° C. in the atmosphere of a mixture of ammonia and nitrogen. The temperature is raised within about 3 to 5 minutes, i.e. within a relatively short time. In this case, as shown in FIG. 10B, concavities and convexities having a diameter and a depth on the order of several tens of nanometers are produced at the entire surface of the InGaN layer 114. Conceivably, this is because InN crystals having a vapor pressure that is orders of magnitude greater than that of the InGaN layer evaporate from the InGaN active layer during the temperature increase.

Next, TMG and carrier hydrogen are added at 20 μmol/min and 2 L/min, respectively, and thereby a GaN single crystal layer 115 is grown to have a thickness of about 1 μm as shown in FIG. 10C. Thereafter, only the supply of TMG is stopped, and the substrate is cooled to room temperature in an atmosphere containing ammonia, hydrogen, and nitrogen.

As a result of the growth carried out by the steps described above, gaps having a diameter and a depth on the order of several tens of nanometers can be produced at the interface between the InGaN single crystal layer 114 and the GaN single crystal layer 115 located at the top as shown in FIG. 10C.

In the present example, in order to produce gaps at the interface between the GaN single crystal layer 115 and the InGaN single crystal layer 114 located on the substrate side thereof, the InGaN layer 114 was heat-treated. However, it is to be understood that in the case of an AlGaInN layer containing In, the same effect can be obtained. As the method of forming concavities and convexities at the surface of the InGaN layer 114 to produce gaps, a heat treatment is useful, and particularly, rapid temperature increase is effective. A mole fraction of In contained in the InGaN layer 114 is preferably at least 10% but is not limited as long as In is contained. Furthermore, preferably, the film thickness is at least 100 nm. However, gaps can be obtained when the thickness is at least 10 nm.

In the present example, the description was made with respect to the case of vacuum growth. However, similar effects can be obtained by the growth carried out in an atmospheric or pressurized atmosphere.

Using the seed substrate described above, Group III nitride crystals are grown in a melt containing alkali metal and at least one Group III element selected from gallium, aluminum, and indium, in an atmosphere containing nitrogen. When this seed substrate is used, the crystals are separated easily in the vicinities of the gaps, so that a substrate is obtained easily that is formed of Group III nitride crystals alone.

EXAMPLE 7

Figure 11A:
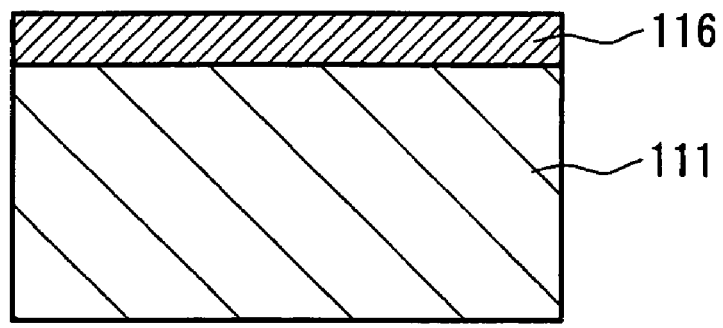
FIGS. 11A to 11C are cross-sectional views showing steps of a further example of a manufacturing method according to the present invention.
Figure 11B:
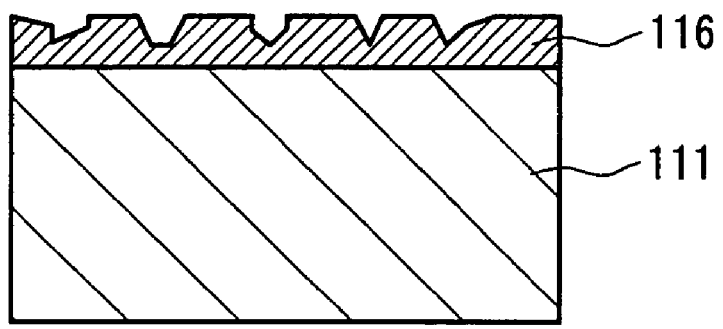
Figure 11C:
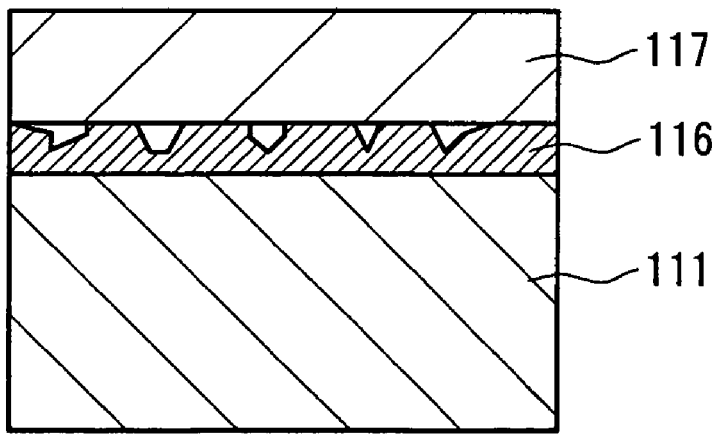

As shown in FIGS. 11A to 11C, crystal growth is carried out using the metal organic chemical vapor deposition (MOCVD) method. In other words, prior to the vapor deposition, a sapphire C-plane substrate 111 is placed on a susceptor located inside a reactor and is heated in a hydrogen atmosphere of 200 Torr at 1050° C. for 15 minutes after the reactor is evacuated of air, and thereby the substrate surface is cleaned.

Subsequently, after the substrate is cooled to 600° C., trimethylgallium (TMG) is allowed to flow at 20 μmol/min, trimethylindium (TMI) at 200 μmol/min, ammonia at 2.5 L/min, and carrier nitrogen at 2 L/min. As a result, an InGaN buffer layer 116 is deposited in a polycrystalline state to have a thickness of 20 nm to 100 nm as shown in FIG. 11A. In this case, the optimum deposition temperature is 500° C. to 600° C.

Subsequently, the supply of TMG and TMI is stopped and the substrate temperature is raised to 1090° C. The temperature is raised within about 3 to 5 minutes, i.e. within a relatively short time. In this case, as shown in FIG. 11B, concavities and convexities having a diameter and a depth on the order of several tens of nanometers are produced at the entire surface of the InGaN buffer layer 116. Next, carrier hydrogen is added to flow at 2 L/min and then TMG is supplied again, and thereby a GaN single crystal layer 117 is formed to have a thickness of about 1 μm as shown in FIG. 11C. It is desirable that the thickness is at least 0.5 μm in order to improve the c-axis orientation. A preferable growth temperature range is higher than 1000° C. but not higher than 1200° C.

Finally, only the supply of TMG is stopped and the substrate is cooled to room temperature in an atmosphere containing ammonia, hydrogen, and nitrogen.

As a result of the growth carried out by the steps described above, gaps having a diameter and a depth on the order of several tens of nanometers can be produced at the interface between the InGaN buffer layer 116 and the GaN single crystal layer 117 located at the top as shown in FIG. 11C.

In the present example, in order to produce gaps at the interface between the GaN single crystal layer 117 and the InGaN buffer layer 116 located on the substrate side thereof, the InGaN buffer layer 116 was heat-treated. However, it is to be understood that in the case of an AlGaInN buffer layer containing In, similar effects can be obtained. As the method of forming concavities and convexities at the surface of the InGaN buffer layer 116 to produce gaps, a heat treatment is useful, and particularly, rapid temperature increase is effective. A mole fraction of In contained in the InGaN buffer layer 116 is preferably at least 10% but is not limited as long as In is contained. Furthermore, preferably, the film thickness is at least 100 nm. However, gaps can be obtained when the thickness is at least 10 nm.

Using the seed substrate described above, Group III nitride crystals are grown in a melt containing alkali metal and at least one Group III element selected from gallium, aluminum, and indium, in an atmosphere containing nitrogen. When this seed substrate is used, the crystals are separated easily in the vicinities of the gaps, so that a substrate is obtained easily that is formed of Group III nitride crystals alone.

According to the manufacturing methods of the present invention, substrates can be manufactured easily that has less warping and is formed of high-quality Group III nitride crystals alone.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a Group III nitride substrate, the method comprising:
   (i) forming a Group III nitride layer having a cycle of gaps of at least 100 μm, on a substrate;
   (ii) bringing a surface of the Group III nitride layer into contact with a melt containing alkali metal and at least one Group III element selected from gallium, aluminum, and indium, in an atmosphere containing nitrogen, to make the at least one Group III element and the nitrogen react with each other to grow Group III nitride crystals on the Group III nitride layer; and
   (iii) separating a part including the substrate and a part including the Group III nitride crystals from each other in vicinities of the gaps.

2. The method of manufacturing a Group III nitride substrate according to claim 1, wherein the at least one Group III element is gallium, and the Group III nitride crystals are GaN crystals.

3. The method of manufacturing a Group III nitride substrate according to claim 1, wherein the atmosphere containing nitrogen is a pressurized atmosphere.

4. The method of manufacturing a Group III nitride substrate according to claim 1, wherein in the process (iii), separation is carried out using stress generated by a difference in coefficient of linear expansion between the substrate and the Group III nitride crystals.

5. The method of manufacturing a Group III nitride substrate according to claim 1, wherein the process (i) comprises:
   (i-1) forming a first semiconductor layer expressed by a composition formula of $Al_uGa_vIn_{1-u-v}N$ (wherein $0 \leq u \leq 1$ and $0 \leq v \leq 1$), on the substrate;
   (i-2) forming convex portions by partially removing the first semiconductor layer; and
   (i-3) forming the Group III nitride layer having gaps in its portions other than the convex portions by growing a second semiconductor layer from upper surfaces of the convex portions of the first semiconductor layer, the second semiconductor layer being expressed by a composition formula of $Al_xGa_yIn_{1-x-y}N$ (wherein $0 \leq x \leq 1$ and $0 \leq y \leq 1$),
   wherein in the process (iii), the first semiconductor layer and the second semiconductor layer are separated from each other at the upper surfaces of the convex portions.

6. The method of manufacturing a Group III nitride substrate according to claim 5, wherein the upper surfaces are C-planes.

7. The method of manufacturing a Group III nitride substrate according to claim 5, wherein in the process (i-2), the convex portions are formed in stripes.

8. The method of manufacturing a Group III nitride substrate according to claim 5, wherein in the process (i-2), concave portions that are portions other than the upper surfaces of the convex portions are covered with a mask film.

9. The method of manufacturing a Group III nitride substrate according to claim 8, wherein the mask film contains at least one selected from a group consisting of silicon nitride, oxide silicon, nitride oxide silicon, aluminum oxide, aluminum nitride oxide, titanium oxide, zirconium oxide, and niobium oxide.

10. The method of manufacturing a Group III nitride substrate according to claim 8, wherein the mask film is made of high melting metal or a high melting metallized material.

11. The method of manufacturing a Group III nitride substrate according to claim 8, wherein the mask film contains at least one selected from a group consisting of tungsten, molybdenum, niobium, tungsten silicide, molybdenum silicide, and niobium silicide.

12. A method of manufacturing a Group III nitride substrate, comprising:
   (I) forming convex portions by processing a surface of a substrate;
   (II) growing a Group III nitride layer from upper surfaces of the convex portions to form a seed crystal substrate having a cycle of gaps of at least 100 μm, formed between the substrate and the Group III nitride layer;
   (III) bringing a surface of the Group III nitride layer into contact with a melt containing alkali metal and at least one Group III element selected from gallium, aluminum, and indium, in a pressurized atmosphere containing nitrogen, to make the at least one Group III element and the nitrogen react with each other to grow Group III nitride crystals on the Group III nitride layer; and
   (IV) separating a part including the substrate and a part including the Group III nitride crystals from each other in vicinities of the gaps.

13. The method of manufacturing a Group III nitride substrate according to claim 1, wherein the substrate is a sapphire substrate.

14. The method of manufacturing a Group III nitride substrate according to claim 1, wherein the alkali metal is at least one selected from sodium, lithium, and potassium.

15. The method of manufacturing a Group III nitride substrate according to claim 1, wherein the melt further contains alkaline-earth metal.

16. A method of manufacturing a Group III nitride substrate, the method comprising:
   (i) forming a Group III nitride layer having a cycle of gaps of at least 100 μm, on a substrate;
   (ii) bringing a surface of the Group III nitride layer into contact with a melt containing alkali metal and at least one Group III element selected from gallium, aluminum, and indium, in an atmosphere containing nitrogen, to make the at least one Group III element and the nitrogen react with each other to grow Group III nitride crystals on the Group III nitride layer; and
   (iii) separating a part including the substrate and a part including the Group III nitride crystals from each other in vicinities of the gaps;
   wherein in the process (i), the Group III nitride layer including gaps includes a semiconductor layer expressed by a composition formula of $Al_xGa_yIn_{1-x-y}N$ (wherein $0 \leq x \leq 1$ and $0 \leq y \leq 1$), and after forming the semiconductor layer, the gaps are formed in the semiconductor layer or at a surface of the semiconductor layer through a temperature-programmed heat treatment carried out in an atmosphere of a mixture of ammonia and nitrogen.

17. The method of manufacturing a Group III nitride substrate according to claim 16, wherein the Group III nitride layer including gaps is a semiconductor layer expressed by a composition formula of $Ga_xIn_{1-x}N$ (wherein $0 \leq x \leq 1$).

18. The method of manufacturing a Group III nitride substrate according to claim 16, wherein the temperature-programmed heat treatment is carried out at a programming rate of 50 to 100° C./min.

19. The method of manufacturing a Group III nitride substrate according to claim 16, wherein a cycle of the gaps is at least 30 μm.

20. The method of manufacturing a Group III nitride substrate according to claim 16, wherein a cycle of the gaps is at least 50 μm.

21. The method of manufacturing a Group III nitride substrate according to claim 16, wherein a cycle of the gaps is at least 100 μm.

22. A Group III nitride substrate manufactured by a manufacturing method according to claim 1.

23. The Group III nitride substrate according to claim 22, wherein a cycle of dense dislocation areas is at least 30 μm.

24. The Group III nitride substrate according to claim 22, wherein a cycle of dense dislocation areas is at least 50 μm.

25. The Group III nitride substrate according to claim 22, wherein a cycle of dense dislocation areas is at least 100 μm.

* * * * *